US010576493B2

(12) United States Patent
Egashira et al.

(10) Patent No.: US 10,576,493 B2
(45) Date of Patent: Mar. 3, 2020

(54) SUBSTRATE PROCESSING APPARATUS AND SUBSTRATE PROCESSING METHOD

(71) Applicant: Tokyo Electron Limited, Tokyo (JP)

(72) Inventors: Keisuke Egashira, Kumamoto (JP); Gentaro Goshi, Kumamoto (JP); Hiroshi Marumoto, Kumamoto (JP); Kento Tsukano, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 50 days.

(21) Appl. No.: 15/919,762

(22) Filed: Mar. 13, 2018

(65) Prior Publication Data

US 2018/0264504 A1  Sep. 20, 2018

(30) Foreign Application Priority Data

Mar. 14, 2017  (JP) .................................. 2017-048116
Mar. 14, 2017  (JP) .................................. 2017-048132

(51) Int. Cl.
  B05C 5/02   (2006.01)
  B05C 11/10  (2006.01)
  (Continued)

(52) U.S. Cl.
  CPC ........ B05C 5/0225 (2013.01); B05C 11/1005 (2013.01); B05D 1/26 (2013.01);
  (Continued)

(58) Field of Classification Search
  CPC ..... B05C 5/0225; B05C 11/1005; B05D 1/26; H01L 21/02054; H01L 21/02057;
  (Continued)

(56) References Cited

U.S. PATENT DOCUMENTS 6,067,728 A * 5/2000 Farmer ............. H01L 21/67028
                                                  134/902
6,745,494 B2 * 6/2004 Bergman ........... H01L 21/67028
                                                   34/410
(Continued)

FOREIGN PATENT DOCUMENTS

FR        2927546 A1 *  8/2009  ......... B01D 11/0203
JP        2013-012538 A  1/2013
JP        5986811 B2 *  9/2016
KR        20130110005 A * 10/2013
WO    WO-2009130987 A1 * 10/2009  ............... C01G 9/02

*Primary Examiner* — Stephen M Gravini
(74) *Attorney, Agent, or Firm* — Abelman, Frayne & Schwab

(57) ABSTRACT

Provided is a substrate processing apparatus in which a drying process of drying a substrate using a processing fluid in a supercritical state is performed. The substrate processing apparatus includes: a processing container in which the drying process is performed; a discharge valve provided in a discharge flow path that discharges the processing fluid from the processing container; and a controller configured to control the discharge valve. When the inside of the processing container is decompressed from a first pressure at which the processing fluid is in the supercritical state to an atmospheric pressure, through a second pressure than the first pressure and a third pressure lower than the second pressure, the controller controls a valve opening degree of the discharge valve so that the decompression rate is equal from the second pressure to the third pressure.

9 Claims, 15 Drawing Sheets

(51) Int. Cl.
    *H01L 21/02*       (2006.01)
    *H01L 21/67*       (2006.01)
    *B05D 1/26*        (2006.01)

(52) U.S. Cl.
    CPC .. *H01L 21/02054* (2013.01); *H01L 21/02057* (2013.01); *H01L 21/02101* (2013.01); *H01L 21/67034* (2013.01); *H01L 21/67253* (2013.01)

(58) Field of Classification Search
    CPC ....... H01L 21/202101; H01L 21/67034; H01L 21/67253
    USPC .......................................................... 34/570
    See application file for complete search history.

(56) References Cited

U.S. PATENT DOCUMENTS

| | | | | |
|---|---|---|---|---|
| 6,802,961 | B2* | 10/2004 | Jackson | B01D 17/0205 |
| | | | | 210/86 |
| 6,920,703 | B2* | 7/2005 | Taktsu | G03F 7/40 |
| | | | | 134/902 |
| 9,536,797 | B2* | 1/2017 | Igarashi | H01L 22/12 |
| 10,109,506 | B2* | 10/2018 | Kim | H01L 21/67017 |
| 10,197,333 | B2* | 2/2019 | Kim | F26B 21/145 |
| 2003/0088995 | A1* | 5/2003 | Bergman | H01L 21/67028 |
| | | | | 34/415 |
| 2005/0158477 | A1* | 7/2005 | Vezin | C23C 26/00 |
| | | | | 427/430.1 |
| 2018/0264504 | A1* | 9/2018 | Egashira | B05C 5/0225 |
| 2019/0051519 | A1* | 2/2019 | Tsukano | H01L 21/67028 |

* cited by examiner

SUBSTRATE PROCESSING APPARATUS AND SUBSTRATE PROCESSING METHOD

CROSS-REFERENCE TO RELATED APPLICATION

This application is based on and claims priority from Japanese Patent Application Nos. 2017-048116 and 2017-048132 filed on Mar. 14, 2017 with the Japan Patent Office, the disclosures of which are incorporated herein in their entireties by reference.

TECHNICAL FIELD

Exemplary embodiments disclosed herein relate to a substrate processing apparatus and a substrate processing method.

BACKGROUND

In the related art, there has been known a method of drying a semiconductor wafer (hereinafter, referred to as a "wafer") as a substrate, in which, in a drying step after a surface of the wafer is processed with a liquid, the wafer in a state where the surface thereof is wet with the liquid is dried by bringing the wafer into contact with a processing fluid in a supercritical state (see, e.g., Japanese Patent Laid-Open Publication No. 2013-12538).

SUMMARY

A substrate processing apparatus according to the present disclosure is a substrate processing apparatus in which a drying process of drying a substrate using a processing fluid in a supercritical state is performed. The substrate processing apparatus includes: a discharge valve provided in a discharge flow path that discharges the processing fluid from the processing container; and a controller configured to control the discharge valve. When the inside of the processing container is decompressed from a first pressure at which the processing liquid is in a supercritical state to an atmospheric pressure, through a second pressure lower than the first pressure and a third pressure lower than the second pressure, the controller controls a valve opening degree of the discharge valve such a manner that a decompression rate is equal from the second pressure to the third pressure.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

DETAILED DESCRIPTION

Figure 1:
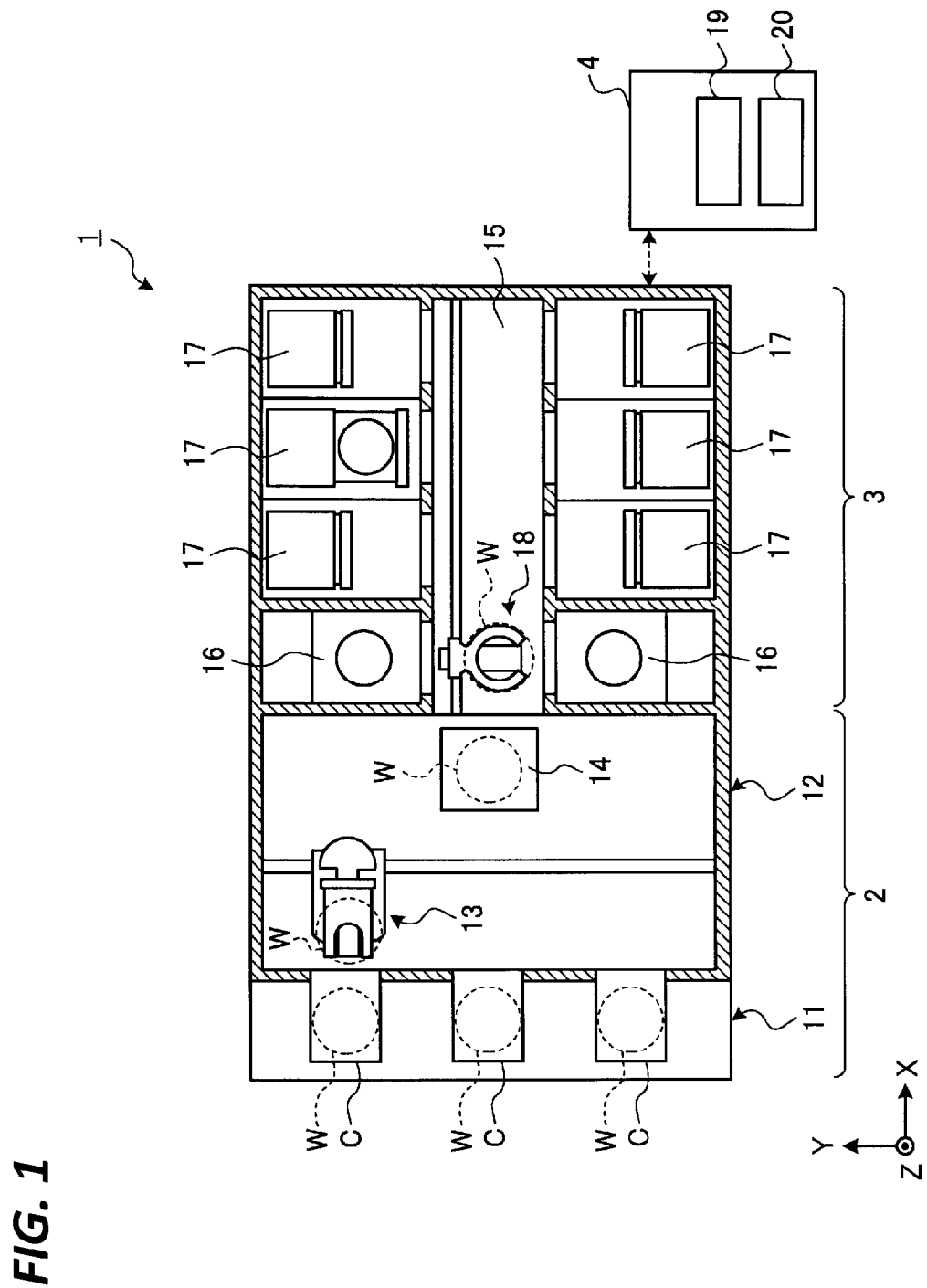
FIG. 1 is a schematic view illustrating a schematic configuration of a substrate processing system according to an exemplary embodiment.

In the following detailed description, reference is made to the accompanying drawings, which form a part thereof. The illustrative embodiments described in the detailed description, drawings, and claims are not meant to be limiting. Other exemplary embodiments may be utilized, and other changes may be made without departing from the spirit or scope of the subject matter presented here.

In the drying method using the processing fluid in the supercritical state in the related art, since the processing container after bringing the wafer and the processing fluid into contact with each other is decompressed through an orifice having a constant valve opening degree, much time is required to decompress the processing container from a high pressure state to an atmospheric pressure. Therefore, there is a problem that the time required for the entire drying process using the processing fluid in the supercritical state becomes long.

An aspect of the above-described exemplary embodiment has been presented in consideration of the above-described problem, and provides a substrate processing apparatus and a substrate processing method capable of shortening the time required for the entire drying process in a drying method using a processing fluid in a supercritical state.

The substrate processing apparatus according to the aspect of the exemplary embodiment is a substrate processing apparatus in which a drying process of drying a substrate using a processing fluid in a supercritical state is performed. The substrate processing apparatus includes: a processing container in which the drying process is performed; a discharge valve provided in a discharge flow path that discharges the processing fluid from the processing container; and a controller configured to control the discharge valve. When the inside of the processing container is decompressed from a first pressure at which the processing liquid is in a supercritical state to an atmospheric pressure, through a second pressure lower than the first pressure and a third pressure lower than the second pressure, the controller controls a valve opening degree of the discharge valve in such a manner that a decompression rate is equal from the second pressure to the third pressure.

In the above-described substrate processing apparatus, the processing fluid is in a supercritical state at the second pressure and in a gaseous state at the third pressure.

In the above-described substrate processing apparatus, when the processing container is decompressed from the first pressure to the atmospheric pressure, the controller controls the discharge valve so as to gradually decrease the valve opening degree and then gradually increase the valve opening degree.

In the above-described substrate processing apparatus, the third pressure is equal to the atmospheric pressure.

In the above-described substrate processing apparatus, the discharge valve is a variable valve of which the valve opening degree is adjustable.

In the above-described substrate processing apparatus, the discharge flow path includes two or more discharge flow path portions which are arranged in parallel, and two or more discharge valves are provided in the two or more discharge flow path portions, respectively.

In the above-described substrate processing apparatus, the discharge flow path includes an ejector further provided therein to cause the fluid to flow through a flow path different from the discharge flow path and to decompress the inside of the processing container using a flow of the fluid in the different flow path, and the ejector is operated from the third pressure to the atmospheric pressure to decompress the inside of the processing container.

A substrate processing apparatus according to another aspect of the exemplary embodiment is a substrate processing apparatus in which a drying process of drying a substrate using a processing fluid in a supercritical state is performed. The substrate processing apparatus includes: a processing container in which the drying process is performed; a forced exhaust mechanism provided in a discharge flow path that discharges the processing fluid from the processing container and configured to forcibly exhaust and decompress the inside of the processing container; and a controller configured to control the forced exhaust mechanism. When the inside of the processing container is decompressed from a first pressure at which the processing liquid is in a supercritical state to an atmospheric pressure, through a second pressure lower than the first pressure, the controller does not operate the forced exhaust mechanism from the first pressure to the second pressure and operates the forced exhaust mechanism from the second pressure to the atmospheric pressure.

A substrate processing apparatus according to an aspect of the exemplary embodiment is a substrate processing method by which a drying process of drying a substrate using a processing fluid in a supercritical state is performed. The substrate processing method includes: a first decompressing step of reducing the pressure of a processing container in which the drying process is performed from a first pressure at which the processing fluid is in a supercritical state to a second pressure lower than the first pressure; a second decompressing step of reducing the pressure of the processing container from the second pressure to a third pressure lower than the second pressure; and a third decompressing step of reducing the pressure of the processing container from the third pressure to an atmospheric pressure. The second decompressing step is performed in such a manner that the pressure in the processing container is reduced at an equal decompression rate.

According to the aspect of the exemplary embodiment, the time required for the entire drying process can be shortened in the drying method using the processing fluid in the supercritical state.

Hereinafter, the exemplary embodiments of the substrate processing apparatus and the substrate processing method disclosed herein will be described in detail with reference to the accompanying drawings. Further, the present disclosure is not limited by the following exemplary embodiments.

<Outline of Substrate Processing System>

First, a schematic configuration of a substrate processing system 1 according to an exemplary embodiment will be described with reference to FIG. 1. FIG. 1 is a view illustrating a schematic configuration of the substrate processing system 1 according to the exemplary embodiment. In the following description, in order to clarify the positional relationship, the X axis, the Y axis, and the Z axis orthogonal to each other are defined, and the Z axis positive direction is defined as the vertical upward direction.

As illustrated in FIG. 1, the substrate processing system 1 includes a carry-in/carry-out station 2 and a processing station 3. The carry-in/carry-out station 2 and the processing station 3 are installed adjacent to each other.

The carry-in/out station 2 includes a carrier placing section 11 and a transfer section 12. In the carrier placing section 11, a plurality of carriers C are placed each of which accommodates a plurality of semiconductor wafers W (hereinafter, referred to as "wafers W") in a horizontal state.

The transfer section 12 is installed adjacent to the carrier placing section 11, and includes a substrate transfer device 13 and a delivery unit 14 therein. The substrate transfer device 13 includes a wafer holding mechanism for holding the wafers W. Further, the substrate transfer device 13 is movable horizontally and vertically and pivotable around a vertical axis, and transfers the wafers W between the carrier C and the delivery unit 14 using the wafer holding mechanism.

The processing station 3 is provided adjacent to the transfer section 12. The processing station 3 includes a transfer section 15, a plurality of cleaning processing units 16, and a plurality of drying processing units 17. The plurality of cleaning processing units 16 and the plurality of drying processing units 17 are provided side by side on both sides of the transfer section 15. Further, the arrangement and the number of the cleaning processing units 16 and the drying processing units 17 illustrated in FIG. 1 are merely examples and are not limited to those illustrated in the drawing.

The transfer section 15 includes a substrate transfer device 18 therein. The substrate transfer device 18 includes a wafer holding mechanism for holding the wafers W. Further, the substrate transfer device 18 is movable horizontally and vertically and pivotable around a vertical axis, and transfers the wafers W among the delivery unit 14, the cleaning processing unit 16, and the drying processing unit 17 using the wafer holding mechanism.

The cleaning processing unit 16 performs a predetermined cleaning process on a wafer W transferred by the substrate transfer device 18. A configuration example of the cleaning processing unit 16 will be described later.

The drying processing unit 17 performs the above-described drying process on the wafer W cleaned by the cleaning processing unit 16. A configuration example of the drying processing unit 17 will be described later.

Further, the substrate processing system 1 includes a control device 4. The control device 4 is, for example, a computer, and includes a controller 19 and a storage unit 20.

The controller 19 includes a microcomputer having, for example, a central processing unit (CPU), a read only memory (ROM), a random access memory (RAM), and an input/output port, and various circuits. The CPU of the microcomputer implements the control to be described later by reading and executing a program stored in the ROM.

Further, the program may be recorded in a computer-readable recording storage medium, and installed from the recording storage medium to the storage unit 20 of the control device 4. The computer-readable recording storage medium may be, for example, a hard disc (HD), a flexible disc (FD), a compact disc (CD), a magneto-optical disc (MO), or a memory card.

The storage unit 20 is implemented by, for example, a semiconductor memory device such as a RAM or a flash memory, or a storage device such as a hard disk or an optical disk.

In the substrate processing system 1 configured as described above, the substrate transfer device 13 in the carry-in/out station 2 first takes out wafers W from a carrier C placed in the carrier placing section 11, and then places the taken wafers W on the delivery unit 14. The wafers W placed on the delivery unit 14 are taken out from the delivery unit 14 by the substrate transfer device 18 of the processing station 3 and carried into the cleaning processing units 16.

A cleaning process is performed on the wafers W carried into the cleaning processing units 16 by the cleaning processing units 16, and then, carried out from the cleaning processing units 16 by the substrate transfer device 18. The wafers W carried out from the cleaning processing units 16 are carried into the drying processing units 17 by the substrate transfer device 18 and a drying process is performed thereon by the drying processing units 17.

The wafers W dried by the drying processing units 17 are carried out from the drying processing units 17 by the substrate transfer device 18, and placed on the delivery unit 14. Then, the processed wafers W placed on the delivery unit 14 are returned to a carrier C of the carrier placing units 11 by the substrate transfer device 13.

<Outline of Cleaning Processing Unit>

Figure 2:
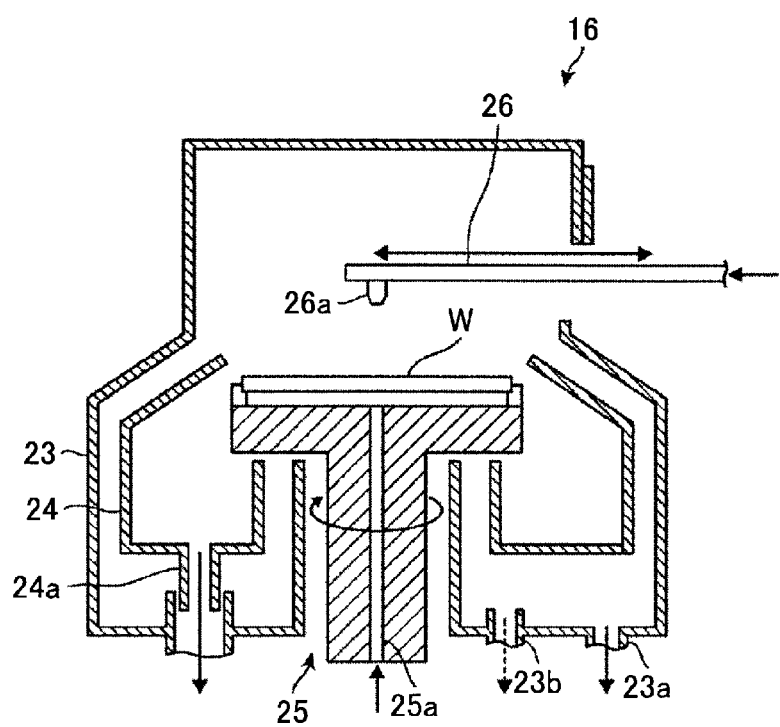
FIG. 2 is a cross-sectional view illustrating a configuration of a cleaning processing unit according to the exemplary embodiment.

Next, the schematic configuration of the cleaning processing unit 16 will be described with reference to FIG. 2. FIG. 2 is a cross-sectional view illustrating a configuration of the cleaning processing unit 16 according to the exemplary embodiment. The cleaning processing unit 16 is configured as a single-wafer cleaning unit that cleans the wafers W one by one, for example, by spin cleaning.

As illustrated in FIG. 2, the cleaning processing unit 16 holds a wafer W substantially horizontally with the wafer holding mechanism 25 disposed in an outer chamber 23 that forms a processing space, and rotates the wafer W by rotating the wafer holding mechanism 25 around the vertical axis. In addition, the cleaning processing unit 16 causes a nozzle arm 26 to be advanced into the upper side of the rotating wafer W and performs a cleaning process of the surface of the wafer W by supplying a chemical liquid and a rinse liquid from a chemical liquid nozzle 26a provided at the front edge portion of the nozzle arm 26 in a predetermined order.

Further, a chemical liquid supply path 25a is also formed inside the wafer holding mechanism 25 in the cleaning processing unit 16. Then, the back surface of the wafer W is cleaned by the chemical liquid and the rinse liquid from the chemical liquid supply path 25a.

In the above-described cleaning process of the wafer W, for example, an SC1 liquid (a mixture of ammonia and hydrogen peroxide), which is an alkaline chemical liquid, is first used to remove particles and an organic contaminant, and then rinse cleaning is performed by deionized water (hereinafter, referred to as "DIW"), which is a rinse liquid. Next, a natural oxide film is removed by a diluted hydrofluoric acid (hereinafter, referred to as "DHF") aqueous solution, which is an acidic chemical liquid, and then rinse cleaning by DIW is performed.

The above-described various types of chemical liquids are received by the outer chamber 23 or an inner cup 24 disposed in the outer chamber 23, and are discharged from a drain port 23a provided in the bottom portion of the outer chamber 23 or a drain port 24a provided in the bottom portion of the inner cup 24. Further, the atmosphere in the outer chamber 23 is exhausted from an exhaust port 23b provided in the bottom portion of the outer chamber 23.

After the rinse process of the wafer W described above, the IPA in a liquid state (hereinafter, referred to as "IPA liquid") is supplied to the front and back surfaces of the wafer W while the wafer holding mechanism 25 is rotated, and the DIW remaining on both surfaces of the wafer W is replaced with the IPA liquid. Thereafter, the rotation of the wafer holding mechanism 25 is gradually stopped.

After the cleaning process is completed in this way, the wafer W is delivered to the substrate transfer apparatus 18 by a transfer mechanism (not illustrated) provided in the wafer holding mechanism 25 in a state in which the IPA liquid 71 (see, e.g., FIG. 6) is deposited on the surface of the wafer (the state in which the liquid film of the IPA liquid 71 is formed on the surface of the wafer W), and is carried out from the cleaning processing unit 16.

Here, the IPA liquid 71 spread over the surface of the wafer W functions as a drying preventing liquid that prevents the occurrence of the pattern collapse due to the evaporation (vaporization) of the liquid on the surface of the wafer W during the transfer of the wafer W from the cleaning processing unit 16 to the drying processing unit 17 or during the carry-in of the wafer W into the drying processing unit 17.

After the cleaning process in the cleaning processing unit 16 is completed, the wafer W having the IPA liquid 71 spread over the surface thereof is transferred to the drying processing unit 17. In addition, the supercritical processing fluid 70 (see, e.g., FIGS. 6A to 6D) is brought into contact with the IPA liquid 71 on the surface of the wafer W in the drying processing unit 17 such that the IPA liquid 71 is dissolved in the supercritical processing fluid 70 and removed, and the wafer W is dried.

<Outline of Drying Processing Unit>

Figure 3:
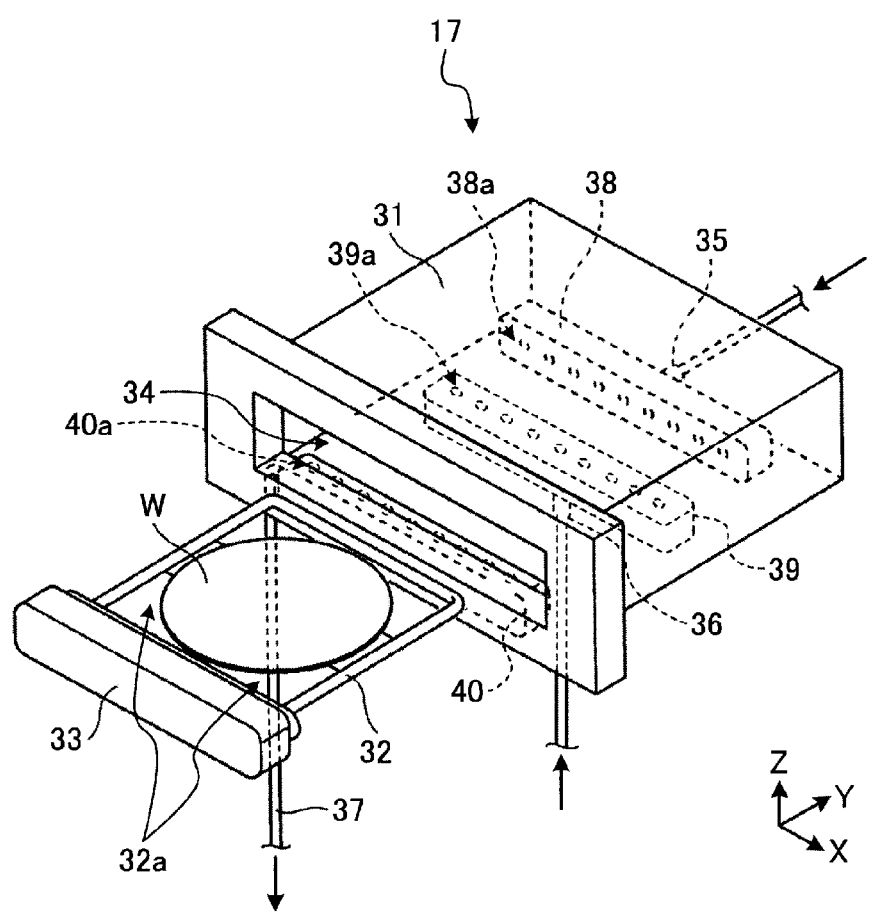
FIG. 3 is an external perspective view illustrating a configuration of a drying processing unit according to the exemplary embodiment.

In the following, the configuration of the drying processing unit 17 will be described first, and then the configuration of the entire system in the drying processing unit 17 will be described. FIG. 3 is an external perspective view illustrating the configuration of the drying processing unit 17. Hereinafter, the drying processing unit 17 in which the drying process is performed is also referred to as a "processing container."

The drying processing unit 17 has a main body 31, a holding plate 32, and a cover member 33. An opening 34 is formed in a housing type main body 31 in order to carry in/out a wafer W therethrough. The holding plate 32 horizontally holds a wafer W which is a processing target. The cover member 33 supports the holding plate 32 and hermetically seals the opening 34 when the wafer W is carried into the main body 31.

The main body 31 is, for example, a container in which a processing space capable of accommodating a wafer W having a diameter of 300 mm is formed, and is provided with supply ports 35 and 36, and a discharge port 37 in the wall thereof. The supply ports 35 and 36 and the discharge port 37 are connected to a supply flow path 50a (see FIG. 4) and a discharge flow path 50b (see FIG. 4) configured to circulate the processing fluid 70 (see, e.g., FIGS. 6A to 6D) and provided on the upstream side and the downstream side of the drying processing unit 17, respectively. A configuration example of the supply flow path 50a and the discharge flow path 50b will be described later.

The supply port 35 is connected to the side surface opposite to the opening 34 in the housing-like main body 31. Further, the supply port 36 is connected to the bottom surface of the main body 31. The discharge port 37 is also connected to the lower side of the opening 34. In addition, FIG. 3 illustrates two supply ports 35 and 36, and one discharge port 37, but the number of the supply ports 35 and 36 and the discharge port 37 is not particularly limited.

Further, fluid supply headers 38 and 39 and a fluid discharge header 40 are provided inside the main body 31. In addition, a plurality of supply ports 38a and 39a are formed in the fluid supply headers 38 and 39 in the longitudinal direction of the fluid supply headers 38 and 39, and a plurality of discharge ports 40a are formed in the fluid discharge header 40 in the longitudinal direction of the fluid discharge header 40.

The fluid supply header 38 is connected to the supply port 35 and is provided adjacent to the side surface opposite to the opening 34 in the housing-like type main body 31. Further, the plurality of supply ports 38a formed side by side in the fluid supply header 38 face the opening 34 side.

The fluid supply header 39 is connected to the supply port 36 and is provided at the center of the bottom surface inside the housing-like main body 31. Further, the plurality of supply ports 39a formed side by side in the fluid supply header 39 face the upper side.

The fluid discharge header 40 is connected to the discharge port 37 and provided adjacent to the side surface on the opening 34 side inside the housing-like main body 31 and below the opening 34. Further, the plurality of discharge ports 40a formed side by side in the fluid discharge header 40 face the upper side.

The fluid supply headers 38 and 39 supply the processing fluid 70 into the main body 31. Further, the fluid discharge header 40 guides the processing fluid 70 in the main body 31 to the outside of the main body 31 and discharges the processing fluid 70. In addition, the processing fluid 70 discharged to the outside of the main body 31 via the fluid discharge header 40 contains the IPA liquid 71 (see, e.g., FIGS. 6A to 6D) dissolved in the supercritical processing fluid 70 from the surfaces of the wafers W.

The processing fluid 70 is supplied into the main body 31 from the supply ports 38a and 39a of the fluid supply headers 38 and 39 arranged as described above and the processing fluid 70 is discharged from the main body 31 through the discharge port 40a of the fluid discharger header 40 so that a laminar flow of the processing fluid 70 flowing in a predetermined direction around the wafers W is formed inside the main body 31.

The laminar flow of the processing fluid 70 flows from, for example, the fluid supply header 38 toward the upper portion of the opening 34 along the surface of the wafer W. In addition, the laminar flow of the processing fluid 70 changes its direction downward above the opening 34 and flows through the vicinity of the opening 34 toward the fluid discharge header 40.

In the example of the laminar flow, an opening 32a is formed between the wafer W and the cover member 33 in the holding plate 32 inside the drying processing unit 17, and the laminar flow of the processing fluid 70 passes through the opening 32a.

In addition, from the viewpoint of reducing the load that may be applied to the wafers W when the processing fluid 70 is supplied into the main body 31 and when the processing fluid 70 is discharged from the main body 31, a plurality of fluid supply headers and a plurality of fluid discharge headers may be provided.

The drying processing unit 17 further includes a pressing mechanism (not illustrated). The pressing mechanism serves to seal the processing space by pushing the cover member 33 toward the main body 31 against an internal pressure caused by the processing fluid 70 in a supercritical state, which is supplied into the processing space of the main body 31. Further, for example, a heat insulating material or a tape heater may be provided on the surface of the main body 31 so that the processing fluid 70 supplied into the processing space maintains a predetermined temperature.

Figure 4:
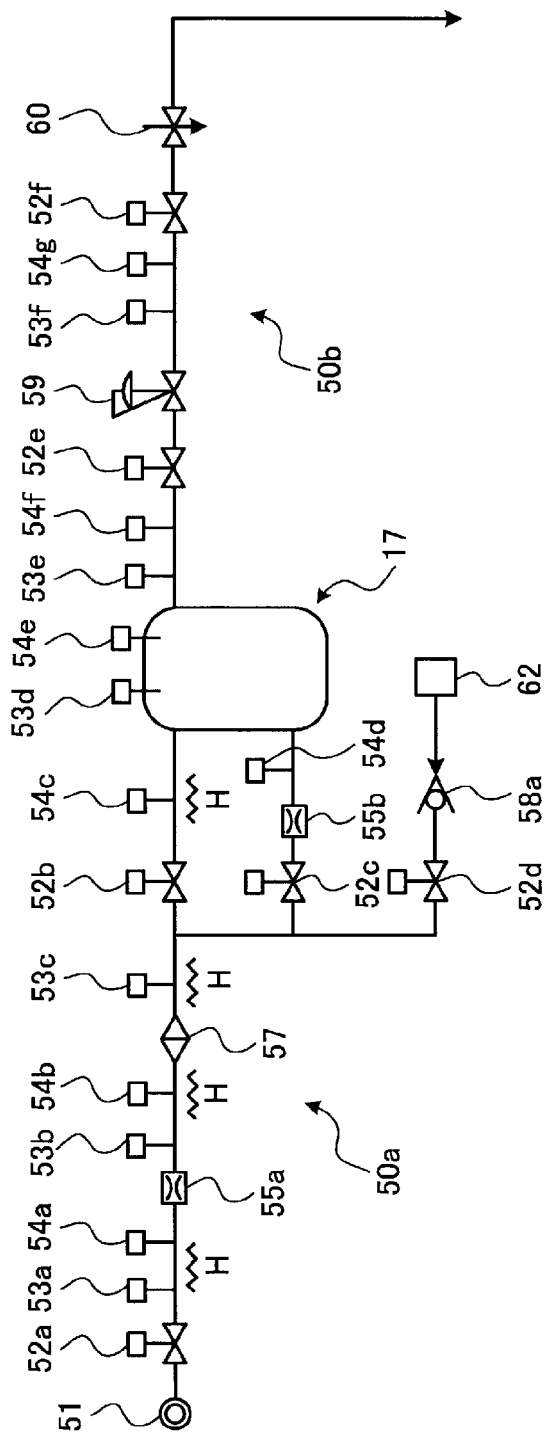
FIG. 4 is a view illustrating a configuration example of the entire system of the drying processing unit according to the exemplary embodiment.

Next, the configuration of the entire system of the drying processing unit 17 will be described with reference to FIG. 4. FIG. 4 is a view illustrating a configuration example of the entire system of the drying processing unit 17 according to the exemplary embodiment. The entire system includes a drying processing 17, a supply flow path 50a for supplying the processing fluid 70 (see FIGS. 6A to 6D) to the drying processing unit 17, and a discharge flow path 50b for discharging the processing fluid 70 from the inside of the drying processing unit 17.

In the entire system, a fluid supply source 51 is provided on the upstream side of the drying processing unit 17, and the processing fluid 70 is supplied from the fluid supply source 51 to the drying processing unit 17 via the supply flow path 50a. The fluid supply source 51 stores, for example, raw material $CO_2$ for generating a $CO_2$ processing fluid 70.

Further, a valve 52a, an orifice 55a, a filter 57, and a valve 52b are sequentially provided between the fluid supply source 51 and the drying processing unit 17 in the supply flow path 50a from the upstream side to the downstream side. In addition, the terms "upstream side" and "downstream side" used herein refer to the flow direction of the processing fluid 70 in the supply flow path 50a (or the discharge flow path 50b).

The valve 52a is a valve that adjusts the on and off of the supply of the processing fluid 70 from the fluid supply source 51, and causes the processing fluid 70 to flow to the supply flow path 50a on the downstream side in the open state and does not cause the processing fluid 70 to flow to the supply flow path 50a on the downstream side in the closed state. For example, when the valve 52a is in the open state, the processing fluid 70 having a high pressure of about 16 to 20 MPa is supplied from the fluid supply source 51 to the supply flow path 50a via the valve 52a.

The orifice 55a has a function of regulating the pressure of the processing fluid 70 supplied from the fluid supply source 51. The orifice 55a may flow the processing fluid 70 whose pressure is adjusted to about 16 MPa, for example, on a supply flow path 50a on the downstream side of the orifice 55a.

The filter 57 removes the foreign matters contained in the processing fluid 70 sent from the orifice 55a and causes the clean processing fluid 70 to flow to the downstream side.

The valve 52b is a valve that adjusts the on and off of the supply of the processing fluid 70 to the drying processing unit 17. The supply flow path 50a connected to the drying processing unit 17 from the valve 52b is connected to a supply port 35 illustrated in FIG. 3, and the processing fluid 70 flowing through the valve 52b is supplied into the main body 31 via the supply port 35 and the fluid supply header 38.

Further, in the entire system of the drying processing unit 17 illustrated in FIG. 4, the supply flow path 50a branches off between the filter 57 and the valve 52b. Specifically, a supply flow path 50a connected to the drying processing unit 17 via the valve 52c and the orifice 55b, and a supply flow path 50a connected to a purging device 62 via a valve 52d and a check valve 58a branch off from the supply flow path 50a between the filter 57 and the valve 52b.

The supply flow path 50a connected to the drying processing unit 17 via the valve 52c and the orifice 55b is an auxiliary flow path configured to supply the processing fluid 70 to the drying processing unit 17. The supply flow path 50a is connected to a supply port 36 illustrated in FIG. 3, and the processing fluid 70 flowing through the valve 52c is supplied into the main body 31 via the supply port 36 and the fluid supply header 39.

The supply flow path 50a connected to the purging device 62 via the valve 52d and the check valve 58a is a flow path configured to supply an inert gas such as, for example, nitrogen to the drying processing unit 17, and is utilized, for example, when the supply of the processing fluid 70 from the fluid supply source 51 to the drying processing unit 17 is stopped.

For example, when the drying processing unit 17 is filled with the inert gas and kept clean, the valve 52d and the valve 52b are controlled to be in the open state, and the inert gas sent from the purging device 62 to the supply flow path 50a is supplied to the drying processing unit 17 via the check valve 58a, the valve 52d, and the valve 52b.

In the discharge flow path 50b on the downstream side of the drying processing unit 17 in the entire system of the drying processing unit 17, a valve 52e, a pressure regulating valve 59, a valve 52f, and a discharge valve 60 are sequentially provided from the upstream side to the downstream side.

The valve 52e is a valve that adjusts the on and off of the discharge of the processing fluid 70 from the drying processing unit 17. When the processing fluid 70 is discharged from the drying processing unit 17, the valve 52e is controlled to be in the open state, and when the processing fluid 70 is not discharged from the drying processing unit 17, the valve 52e is controlled to be in the closed state.

Further, the supply flow path 50b extending between the drying processing unit 17 and the valve 52e is connected to the discharge port 37, and the processing fluid 70 inside the main body 31 of the drying processing unit 17 is sent toward the valve 52e via the fluid discharge header 40 and the discharge port 37 illustrated in FIG. 3.

The pressure regulating valve 59 is a valve that adjusts the pressure of the processing fluid 70 in the drying processing unit 17 and may be configured by, for example, a back pressure valve. The opening degree of the pressure regulating valve 59 is adjusted adaptively under the control of the control device 4 in accordance with the desired pressure of the processing fluid 70 in the drying processing unit 17.

The valve 52f is a valve that adjusts the on and off of the discharge of the processing fluid 70 from the drying processing unit 17 to the outside. When the processing fluid 70 is discharged to the outside, the valve 52f is controlled to be in the open state, and when the processing fluid 70 is not discharged, the valve 52f is controlled to be in the closed state.

The discharge valve 60 is a valve that adjusts the discharge amount of the processing fluid 70 from the drying processing unit 17, and may be configured by, for example, a variable valve whose valve opening degree is adjustable. The valve opening degree of the discharge valve 60 is adjusted adaptively under the control of the control device 4 in accordance with the desired discharge amount of the processing fluid 70 from the inside of the main body 31.

Further, when the processing fluid 70 is discharged from the drying processing unit 17, the valve 52e, the valve 52f, the pressure regulating valve 59, and the discharge valve 60 are controlled to be in the open state. The discharge amount of the processing fluid 70 to the outside may be finely controlled by performing the discharge of the processing fluid 70 to the outside through the discharge valve 60, which is a variable valve, in the entire system of the drying processing unit 17.

Further, pressure sensors that detect the pressure of the processing fluid 70 and temperature sensors that detect the temperature of the processing fluid 70 are provided at various points of the above-described supply flow path 50a and discharge flow path 50b. In the example illustrated in FIG. 4, a pressure sensor 53a and a temperature sensor Ma are provided between the valve 52a and the orifice 55a, and a pressure sensor 53b and a temperature sensor 54b are provided between the orifice 55a and the filter 57.

In addition, a pressure sensor 53c is provided between the filter 57 and the valve 52b, a temperature sensor 54c is provided between the valve 52b and the drying processing unit 17, a temperature sensor 54d is provided between the orifice 55b and the drying processing unit 17, and a temperature sensor 54e is provided in the drying processing unit 17.

In addition, a pressure sensor 53d and a temperature sensor 54f are provided between the drying processing unit 17 and the valve 52e, and a pressure sensor 53f and a temperature sensor 54g are provided between the pressure regulating valve 59 and the valve 52f.

Further, a heater H is provided at an arbitrary place where the processing fluid 70 flows in the drying processing unit 17. In the example illustrated in FIG. 4, the heaters H are provided between the valve 52a and the orifice 55a, between the orifice 55a and the filter 57, between the filter 57 and the valve 52b, and between the valve 52b and the drying processing unit 17 in a supply flow path 50a of the upstream side of the drying processing unit 17.

In the meantime, the heaters H may be provided in the drying processing unit 17 or elsewhere including the discharge flow path 50b on the downstream side of the drying processing unit 17. That is, the heaters H may be provided in all the flow paths until the processing fluid 70 supplied from the fluid supply source 51 is discharged to the outside.

In the exemplary embodiment, from the viewpoint of adjusting the temperature of the processing fluid 70 supplied to the drying processing unit 17, the heater H may be provided at least at a position where the temperature of the processing fluid 70 flowing at the upstream side of the drying processing unit 17 may be adjusted.

Figure 5:
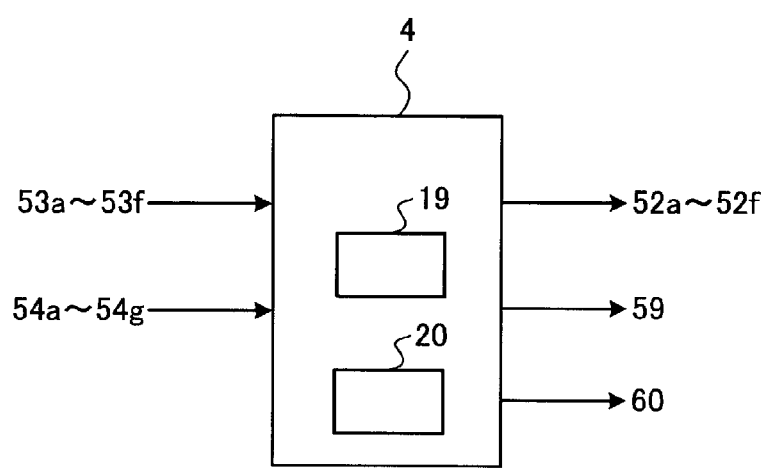
FIG. 5 is a block diagram illustrating a functional configuration of a control device according to the exemplary embodiment.

FIG. 5 is a block diagram illustrating a functional configuration of a control device 4 according to the exemplary embodiment. As described above, the control device 4 includes the controller 19 and the storage unit 20. The control device 4 receives a measurement signal from various elements illustrated in FIG. 4, and also transmits a control instruction signal to various elements illustrated in FIG. 4.

The control device 4 receives the measurement results of the pressure sensors 53a to 53f and the temperature sensors 54a to 54g, and also transmits control instruction signals to the valves 52a to 52f, the pressure regulating valve 59, and the discharge valve 60. Further, the signals that may be transmitted/received by the control device 4 are not particularly limited.

<Outline of Drying Process Using Supercritical Processing Fluid>

Next, an outline of a drying process of the IPA liquid 71 using the processing fluid 70 will be described. FIGS. 6A to 6D are enlarged cross-sectional views for explaining a drying mechanism of the IPA liquid 71 according to the exemplary embodiment, in which patterns P of a wafer W are briefly illustrated.

Figure 6A:
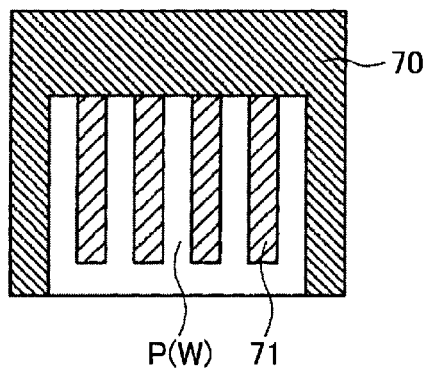
FIGS. 6A to 6D are enlarged cross-sectional views for explaining a drying mechanism of IPA according to the exemplary embodiment, in which a pattern of a wafer is schematically illustrated.

As illustrated in FIG. 6A, only the IPA liquid 71 is filled between the patterns P when the $CO_2$ processing fluid 70 is introduced into the main body 31 of the drying processing unit 17 in the drying processing unit 17.

Figure 6B:
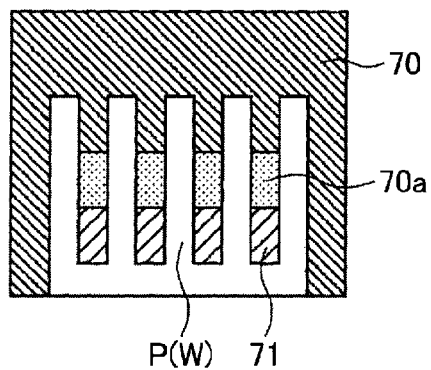

The IPA liquid 71 between the patterns P gradually dissolves in the supercritical processing fluid 70 due to contact with the supercritical processing fluid 70, which is in a high pressure state (e.g., 16 MPa), and is gradually replaced with the processing fluid 70 as illustrated in FIG. 6B. In this case, there is a mixed fluid 70a in which the IPA liquid 71 and the supercritical processing fluid 70 are mixed between the patterns P, in addition to the IPA liquid 71 and the supercritical processing fluid 70.

Figure 6C:
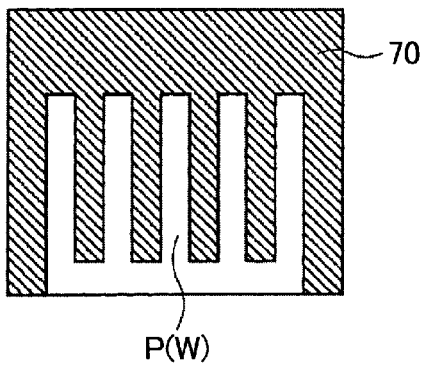

In addition, as the substitution from the IPA liquid 71 to the supercritical processing fluid 70 proceeds between the patterns P, the IPA liquid 71 is removed between the patterns P, and finally, only the supercritical processing fluid 70 fills the area between the patterns P, as illustrated in FIG. 6C.

Figure 6D:
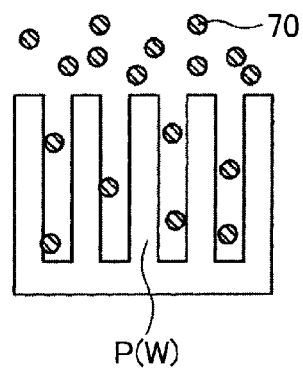

As illustrated in FIG. 6D, after the IPA liquid 71 is removed from the area between the patterns P, the $CO_2$ processing fluid 70 is changed from a supercritical state to a gaseous state by reducing the pressure in the main body 31 from a high pressure to an atmospheric pressure, and only the gas occupies the area between the patterns P. In this way, the IPA liquid 71 in the area between the patterns P is removed and the drying process of the wafer W is completed.

Further, in the exemplary embodiment, the IPA liquid 71 is used as a drying prevention liquid and $CO_2$ is used as the processing fluid 70. However, a liquid other than IPA may be used as a drying prevention liquid and a fluid other than $CO_2$ may be used as the processing fluid 70.

Here, the supercritical processing fluid 70 has a smaller viscosity than the liquid (e.g., the IPA liquid 71) and has a high ability of dissolving the liquid. In addition, there is no interface between the supercritical processing liquid 70 and the liquid or gas in equilibrium. As a result, in the drying process using the above-described supercritical processing fluid 70, the liquid may be dried without being influenced by a surface tension, so that the pattern collapse of the patterns P may be suppressed.

In the meantime, in the drying process using the supercritical processing fluid 70 described with reference to FIGS. 6A to 6D, when reducing the pressure in the drying processing unit 17 from the high pressure to the atmospheric pressure, since the pressure was reduced through an orifice having a constant valve opening degree in the related art, much time was needed to reduce the pressure of the drying processing unit 17 to the atmospheric pressure. Thus, the time required for the entire drying process using the supercritical processing fluid 70 was prolonged.

Therefore, according to the drying process of the substrate processing system 1 according to the exemplary embodiment, it is possible to shorten the time required for the entire drying process by performing a predetermined decompressing process.

<Details of Decompressing Process in Drying Process>

Figure 7A:
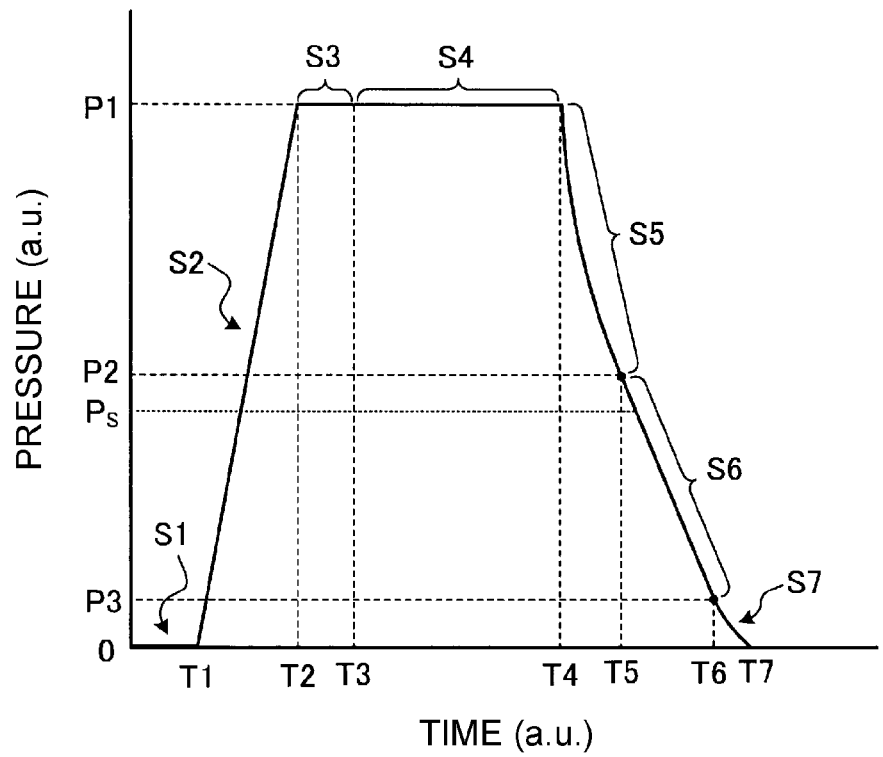
FIG. 7A is a view illustrating an example of a relationship between the time in the entire drying process and the pressure in the processing container according to the exemplary embodiment.

Next, details of the decompressing process in the drying process of the substrate processing system 1 according to the exemplary embodiment will be described with reference to FIGS. 7A and 7B. FIG. 7A is a view illustrating an example of a relationship between the time in the entire drying process and the pressure in the processing container according to the exemplary embodiment.

In the drying processing unit 17, a substrate carry-in process (step S1) is first performed until time T1. In this substrate carry-in process, the wafer W on which the IPA liquid 71 is deposited is carried into the drying processing unit 17. Therefore, as illustrated in FIG. 7A, the pressure in the drying processing unit 17 is an atmospheric pressure (to 0 MPa) in the substrate carry-in process.

Following the substrate carry-in process, in the drying processing unit 17, a fluid introduction process of the processing fluid 70 is performed from time T1 to time T2 (step S2). As a result of the fluid introduction process, the pressure in the drying processing unit 17 is increased from the atmospheric pressure to the first pressure P1 as illustrated in FIG. 7A.

Here, the first pressure P1 is equal to or higher than a critical pressure PS (about 7.2 MPa) at which $CO_2$ as the processing fluid 70 becomes a supercritical state, and is, for example, about 16 MPa. Therefore, by the fluid introduction process, the processing fluid 70 in the drying processing unit 17 undergoes a phase change to a supercritical state. Then, the IPA liquid 71 on the wafer W starts to be dissolved into the processing fluid 70 in the supercritical state.

Following the fluid introduction process, in the drying processing unit 17, a holding process of the processing fluid 70 is performed from time T2 to time T3 (step S3). In the holding process, introduction and discharge of the processing fluid 70 to the drying processing unit 17 are stopped.

Then, until the IPA concentration and the $CO_2$ concentration of the mixed fluid 70a between the patterns P of the wafer become predetermined concentrations (e.g., the IPA concentration is 30% or less and the $CO_2$ concentration is 70% or more), the state in the drying processing unit 17 (e.g., pressure) is maintained constant.

Following the holding process, in the drying processing unit 17, a circulation process of the processing fluid 70 is performed from time T3 to time T4 (step S4). In the circulation process, the processing fluid 70 is caused to flow through the supply flow path 50a and the discharge flow path 50b while controlling the pressure regulating valve 59 so that the pressure in the drying processing unit 17 becomes constant at the first pressure P1.

In the circulation process, the processing fluid 70 including the IPA liquid 71 is discharged from the drying processing unit 17, and a fresh processing liquid not including the IPA liquid 71 is supplied onto the wafer W. Thus, the removal of the IPA liquid 71 from the wafer W is promoted.

Following the circulation process, in the drying processing unit 17, a first decompressing process is performed to reduce the pressure in the drying processing unit 17 from the first pressure P1 to the second pressure P2 from time T4 to time T5 (step S5). Here, the second pressure P2 is lower than the first pressure P1 and higher than the critical pressure PS of $CO_2$, and is, for example, about 8 MPa. Therefore, in the first decompressing process, the inside of the drying processing unit 17 is maintained in the supercritical state.

Figure 7B:
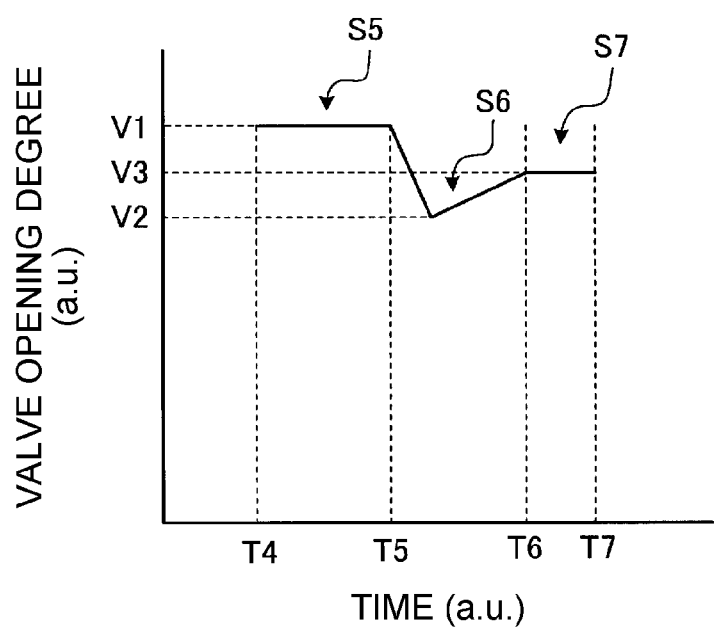
FIG. 7B is a view illustrating an example of a relationship between the time in a first decompressing process, a second decompressing process, and a third decompressing process and a valve opening degree of a discharge valve according to the exemplary embodiment.

FIG. 7B is a view illustrating an example of a relationship between the time in a first decompressing process, a second decompressing process, and a third decompressing process and a valve opening degree of a discharge valve 60 according to the exemplary embodiment. In the first decompressing process (step S5), the valve opening degree of the discharge valve 60 in the discharge flow path 50b is constant at a predetermined valve opening degree V1, as illustrated in FIG. 7B. Further, after the first decompressing process, the pressure regulating valve 59 is controlled to be maintained, for example, in the fully open state.

Here, the valve opening degree V1 of the discharge valve 60 is larger than the valve opening degree of the orifice used for the discharge flow path in the related art. Therefore, according to the exemplary embodiment, the decompressing time of the drying processing unit 17 may be shortened.

Following the first decompressing process, as illustrated in FIG. 7A, in the drying processing unit 17, a second decompressing step is performed to reduce the pressure in the drying processing unit 17 from the second pressure P2 to the third pressure P3 from time T5 to time T6 (step S6). Here, the third pressure P3 is lower than the second pressure P2 and the critical pressure PS of the processing fluid 70 and higher than the atmospheric pressure. Therefore, in the second decompressing process, the processing fluid 70 in the drying processing unit 17 undergoes a phase change from the supercritical state to the gaseous state (see FIG. 6D).

Here, in the second decompressing process, by controlling the valve opening degree of the discharge valve 60, the inside of the drying processing unit 17 is decompressed so that the decompression rate becomes equal from the second pressure P2 to the third pressure P3 as illustrated in FIG. 7A. Specifically, while the pressure in the drying processing unit 17 is measured with the pressure sensor 53d, the valve opening degree of the discharge valve 60, which is a variable valve, is controlled with the controller 19 (see FIG. 7B) so as to gradually decrease from the valve opening degree V1 to the valve opening degree V2 and then gradually increase to the valve opening degree V3, whereby the pressure may be reduced at the same decompression rate.

Here, when the pressure is reduced from the first pressure P1 to the critical pressure PS or less with a constant valve opening degree V1 greater than that of the orifice in the related art, the temperature in the drying processing unit 17 is lowered, and the processing fluid 70 in the drying processing unit 17 undergoes a sudden phase change from the supercritical state to the gaseous state. As a result, the state of the processing fluid 70 in the drying processing unit 17 may be unstable.

In addition, when the state of the processing fluid 70 in the drying processing unit 17 becomes unstable, there is a possibility that problems, such as generation of particles inside the drying processing unit 17 or collapse of the pattern P of the wafer W, may occur.

However, in the exemplary embodiment, the inside of the drying processing unit 17 is decompressed such that the decompression is performed at an equal decompression rate in the second decompressing process. Thus, it is possible to stably maintain the state of the processing fluid 70 in the drying processing unit 17 when the drying processing unit 17 is below the critical pressure PS. Therefore, according to the exemplary embodiment, generation of particles inside the drying processing unit 17, collapse of the pattern P of the wafer W, or the like may be suppressed.

That is, in the exemplary embodiment, it is possible to shorten the decompressing time of the drying processing unit 17 while stably maintaining the processing fluid 70 in the drying processing unit 17. Therefore, according to the exemplary embodiment, in the drying method using the processing fluid 70 in the supercritical state, it is possible to shorten the time required for the entire drying process.

Also, the decompression rate in the second decompressing process is a decompression rate at which the state of the processing fluid 70 in the drying processing unit 17 may be stably maintained, and is, for example, about 0.6 MPa/s.

Following the second decompressing process, in the drying process unit 17, a third decompressing process of reducing the pressure in the drying process unit 17 from the third pressure P3 to the atmospheric pressure is performed from time T6 to time T7 (step S7). In the third decompressing process, as illustrated in FIG. 7B, the valve opening degree of the discharge valve 60 in the discharge flow path 50b is maintained at a predetermined valve opening degree V2.

Then, at time T7 at which the third decompressing process ends, the inside of the drying processing unit 17 returns to the atmospheric pressure, and the drying process of the wafer W by the processing fluid 70 in the supercritical state is completed.

As described above, in the drying process according to the exemplary embodiment, in the decompressing processes (the first decompressing process to the third decompressing process) in the drying processing unit 17, the valve opening degree of the discharge valve 60 provided in the discharge flow path 50b is controlled so as to increase from the first pressure P1 to the second pressure P2, gradually decrease from the second pressure P2, and then gradually increase until the atmospheric pressure is reached (see FIG. 7B). As a result, it is possible to shorten the decompressing time of the drying processing unit 17 while stably maintaining $CO_2$ in the drying processing unit 17.

Further, in the exemplary embodiment, the second decompressing process is performed using the discharge valve 60, which is a variable valve. As a result, it is possible to reduce the pressure while finely controlling the valve opening degree, so that it is possible to stably implement an equal decompression rate. Therefore, according to the exemplary embodiment, generation of particles inside the drying processing unit 17, collapse of the pattern P of the wafer W, or the like may be effectively suppressed using the discharge valve 60, which is a variable valve.

Further, in the exemplary embodiment, as illustrated in FIG. 7A, the pressure in the drying processing unit 17 is raised at a constant rate in the fluid introduction process (step S2), but in the fluid introduction process, the pressure in the drying processing unit 17 may not be raised at a constant rate.

In addition, in the exemplary embodiment, as illustrated in FIG. 7B, the valve opening degree of the discharge valve 60 is caused to gradually decrease and then gradually increase in the second decompressing process (step S6). However, in the second decompressing process, the valve opening degree of the discharge valve 60 may be caused to gradually decrease at a constant rate and the pressure in the drying processing unit 17 may be controlled so that the decompression rate is equal.

Further, in the exemplary embodiment, an ejector may be further provided in the discharge flow path 50b. The ejector is a mechanism that is capable of decompressing the inside of the drying processing unit 17 by causing a fluid such as a liquid or a gas to flow through a flow path different from the discharge flow path 50b and using the flow of the fluid in the different flow path. With such an ejector, the processing fluid 70 in the drying processing unit 17 may be forcibly exhausted.

Here, in the exemplary embodiment, the ejector is operated at the time of the third decompressing process (step S7) to decompress the inside of the drying processing unit 17, thereby forcibly exhausting the process fluid 70, so that the decompressing time of the third decompressing process (step S7) may be further shortened.

In this case, for example, by setting the third pressure P3 to about 0.3 MPa, it is possible to perform the third decompressing process (step S7) using a general ejector, and not an expensive ejector of a high pressure specification. Therefore, the drying process of the substrate processing system 1 at low cost may be performed.

Figure 8:
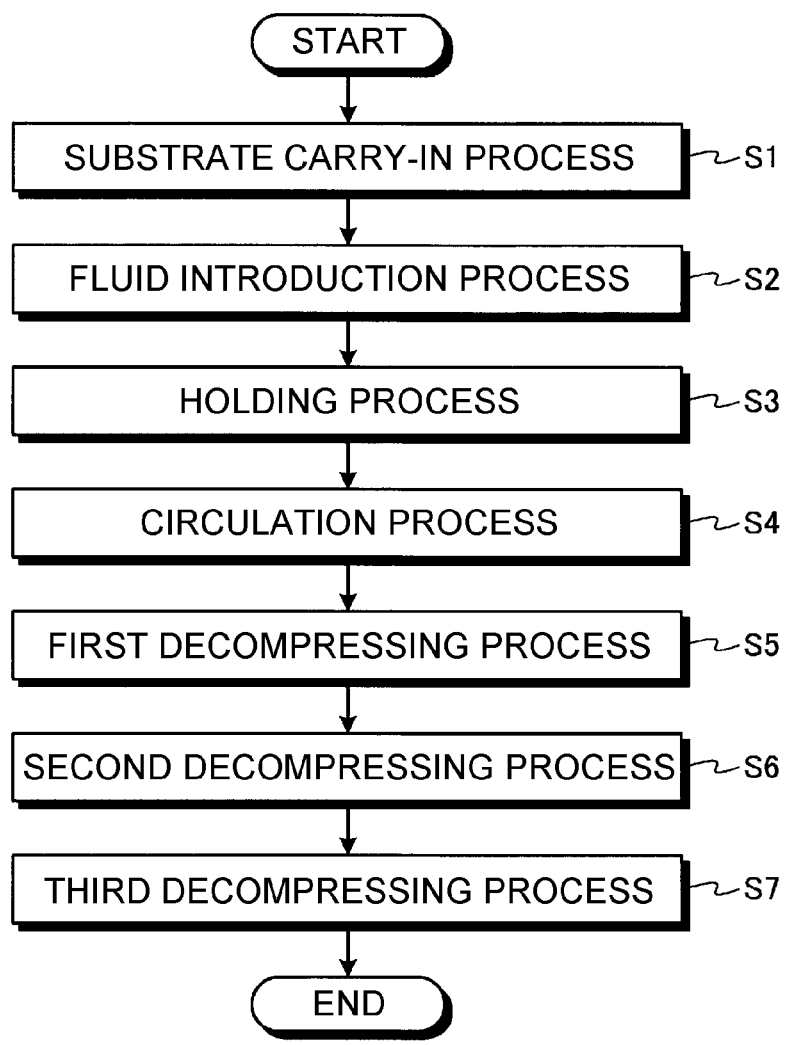
FIG. 8 is a flowchart illustrating a processing procedure in a drying process of the substrate processing system according to the exemplary embodiment.

FIG. 8 is a flowchart illustrating a processing procedure in a drying process of the substrate processing system 1 according to the exemplary embodiment. Further, the drying process of the substrate processing system 1 illustrated in FIG. 8 is performed when the controller 19 reads the program stored in the storage unit 20 of the control device 4 and controls the cleaning processing unit 16, the drying processing unit 17, or the like based on the read instruction.

First, the substrate transfer device 18 (see FIG. 1) carries the wafer W into the cleaning processing unit 16. The wafer W is held by the wafer holding mechanism 25 (see FIG. 2) in a state in which the surface on which the pattern P is formed is directed upward. Thereafter, the controller 19 controls the cleaning processing unit 16 to perform a cleaning process of the wafer W.

In the above-described cleaning process, for example, removal of particles and an organic contaminant by the SC1 liquid is first performed by spin cleaning, and then rinse cleaning is performed by DIW. Thereafter, a natural oxide film is removed by DHF, and then rinse cleaning by DIW is performed. Finally, while rotating the wafer holding mechanism 25, a predetermined amount of IPA liquid 71 is supplied to the front surface and the back surface of the wafer W, and the DIW remaining on both surfaces of the wafer W is replaced. Thereafter, the rotation of the wafer holding mechanism 25 is gradually stopped.

The amount of the IPA liquid 71 which is supplied and spread at the end of the cleaning process is sufficient to prevent pattern collapse in the pattern P due to vaporization of the IPA liquid 71 on the surface of the wafer W, for example, during transfer of the wafer W from the cleaning processing unit 16 to the drying processing unit 17 or during transfer of the wafer W to the drying processing unit 17.

Subsequently, the substrate transfer device 18 performs a substrate carry-in process of carrying out the wafer W on which the liquid is deposited from the cleaning processing unit 16 and carrying the wafer W into the drying processing unit 17 (step S1). In the substrate carry-in process, the wafer W on which the IPA liquid 71 is deposited first held by the holding plate 32 (see FIG. 3). Thereafter, the holding plate 32 and the cover member 33 are accommodated in the main body 31 together with the wafer on which the liquid is deposited, and the opening 34 is hermetically sealed by the cover member 33.

In the substrate carry-in process, the valves 52a to 52f, the pressure regulating valve 59, and the discharge valve 60 illustrated in FIG. 4 are all controlled to be in the closed state.

Subsequently, in the drying processing unit 17, a fluid introduction process of introducing the processing fluid 70 into the drying processing unit 17 is performed (step S2). In the fluid introduction process, the controller 19 changes the valves 52a, 52b, 52c, 52e, and 52f and the discharge valve 60 from the closed state to the open state. In addition, the controller 19 controls the valve opening degree of the pressure regulating valve 59 so as to adjust the pressure of the processing fluid 70 in the drying processing unit 17 to reach a predetermined first pressure P1. Further, the closed state of the valve 52d is maintained.

In the fluid introduction process, in the drying processing unit 17, the IPA liquid 71 on the wafer W starts to melt into the processing fluid 70 in the supercritical state. Further, when the processing fluid 70 in the supercritical state and the IPA liquid 71 on the wafer W start to mix, IPA and $CO_2$ locally vary in proportion in the mixed fluid 70a, and the critical pressure of $CO_2$ also locally changes to various values.

However, in the fluid introduction process according to the exemplary embodiment, the supply pressure of the processing fluid 70 into the drying processing unit 17 is adjusted so as to be higher than all the critical pressures of $CO_2$ (i.e., higher than the maximum value of the critical pressures). As a result, regardless of the ratio of IPA and $CO_2$ of the mixed fluid 70a, the processing fluid 70 in the drying processing unit 17 becomes a supercritical state or a liquid state and does not become a gaseous state.

Subsequently, in the drying processing unit 17, a holding process of holding the processing fluid 70 in the drying processing unit 17 is performed (step S3). In the holding process, the controller 19 changes the valves 52b, 52c, and 52e from the open state to the closed state, and stops the introduction and discharge of the processing fluid 70 to and from the drying processing unit 17. Further, the valves 52a and 52f and the discharge valve 60 are maintained in the open state, and the valve 52d is maintained in the closed state. In addition, the pressure regulating valve 59 is maintained at a predetermined valve opening degree at which the pressure in the drying processing unit 17 becomes the first pressure P1.

In the holding process, the pressure inside the drying processing unit 17 is maintained such an extent that the processing fluid 70 may maintain the supercritical state, and in the exemplary embodiment, the pressure inside the drying processing unit 17 is maintained at the first pressure P1. Further, the state in the drying processing unit 17 is held constant until the IPA concentration and the $CO_2$ concentration of the mixed fluid 70a between the patterns P of the wafer W reach predetermined concentrations.

Subsequently, in the drying processing unit 17, a circulation process of circulating the processing fluid 70 in the drying processing unit 17 is performed (step S4). In such a circulation process, the controller 19 changes the valves 52b, 52c, and 52e from the closed state to the open state again and resumes the introduction and discharge of the processing fluid 70 to and from the drying processing unit 17. Further, the pressure regulating valve 59 is maintained at a valve opening degree at which the pressure of the processing fluid 70 in the drying processing unit 17 becomes the first pressure P1, and the valve 52d is maintained in the closed state.

In addition, the circulation process is performed until the IPA liquid 71 between the patterns P is replaced with the processing fluid 70 and the IPA liquid 71 remaining in the drying processing unit 17 is sufficiently reduced (e.g., the IPA concentration in the drying processing unit 17 reaches 0% to several %).

Further, in the exemplary embodiment, the circulation process is performed so as to be constant at a predetermined pressure (here, the first pressure P1), but the transition of the pressure of the processing fluid 70 in the circulation process is not limited to this case.

For example, since it is possible to effectively promote replacement of the IPA liquid 71 from the IPA liquid 71 to the processing fluid 70 between the patterns P by repeating the step-up process and the step-down process of the processing fluid 70 in the circulation process, the drying process may be performed in a short time. Further, the step-up process and the step-down process of the processing fluid 70 may be performed by appropriately controlling the valve opening degree of the pressure regulating valve 59 and the discharge valve 60 while measuring the pressure inside the drying processing unit 17 with the pressure sensor 53d.

Subsequently, in the drying processing unit 17, the processing fluid 70 is discharged from the inside of the drying processing unit 17, and a first decompressing process is performed to decompress the inside of the drying processing unit 17 (step S5). In the first decompressing process, the controller 19 changes the valves 52a to 52c from the open state to the closed state, and stops the supply of the processing fluid 70 to the drying processing unit 17.

In addition, the controller 19 changes the pressure regulating valve 59 to the fully open state and changes the valve opening degree of the discharge valve 60 to the valve opening degree V1 and holds it. The valve opening degree V1 is, for example, a valve opening degree at which the discharge valve 60 is fully open. Further, the valves 52d and 52f are maintained in the open state and the valve 52d is maintained in the closed state.

Then, the first decompressing process is performed until the pressure in the drying processing unit 17 reaches a predetermined second pressure P2 from the first pressure P1.

Subsequently, in the drying processing unit 17, a second decompressing process is performed to continuously discharge the processing fluid 70 from the drying processing unit 17 and further decompress the inside of the drying processing unit 17 (step S6). In the second decompressing process, the open/closed states of the valves 52a to 52f and the pressure regulating valve 59 are maintained in the open/closed state in the first decompressing process.

In the meantime, the controller 19 adjusts the valve opening degree of the discharge valve 60 in such a manner that the pressure in the drying processing unit 17 is reduced at an equal decompression rate. For example, as illustrated in FIG. 7B, the controller 19 gradually decreases the valve opening degree of the discharge valve 60 from the valve opening degree V1 to the valve opening degree V2, and then gradually increases the valve opening degree to the valve opening degree V3.

Then, the second decompressing process is performed until the pressure in the drying processing unit 17 reaches a predetermined third pressure P3 from the second pressure P2.

Subsequently, in the drying processing unit 17, a third decompressing process is performed to continuously discharge the processing fluid 70 from the drying processing unit 17 and further decompress the inside of the drying processing unit 17 (step S7). In the third decompressing process, the open/closed states of the valves 52a to 52f and the pressure regulating valve 59 are maintained in the open/closed state in the second decompressing process. Further, the controller 19 holds the valve opening degree of the discharge valve 60 to the valve opening degree V3.

Then, the third decompressing process is performed until the pressure in the drying processing unit 17 reaches the atmospheric pressure from the third pressure P3. Further, in the third decompressing process, as described above, an ejector may be separately provided in the discharge flow path 50b, and the ejector may be operated to forcibly exhaust the processing fluid 70. Upon completion of the third decompressing process, the drying process in the drying processing unit 17 is completed.

MODIFICATION EXAMPLES

Various modifications of the drying process in the substrate processing system 1 according to the exemplary embodiment will be described below. First, a first modification of the drying process will be described with reference to FIGS. 9A, 9B, and 10.

Figure 9A:
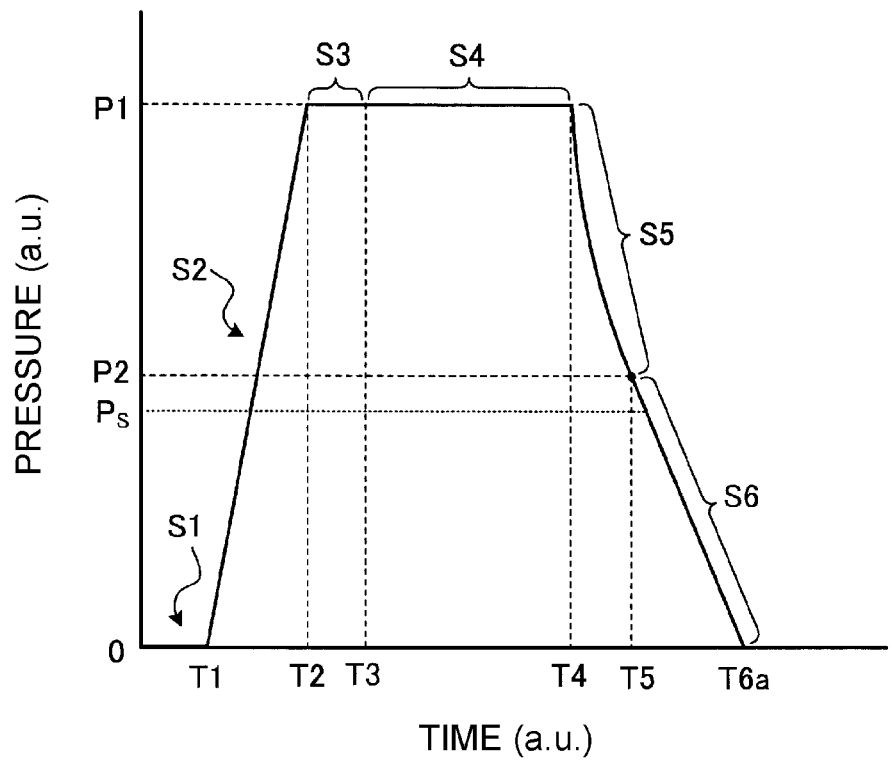
FIG. 9A is a view illustrating an example of a relationship between the time in the entire drying process and the pressure in the processing container according to a first modification of the exemplary embodiment.

FIG. 9A is a view illustrating an example of a relationship between the time in the entire drying process and the pressure in the processing container according to the first modification of the exemplary embodiment. As illustrated in FIG. 9A, in the first modification, the second decompressing process (step S6) is not performed until the pressure in the drying processing unit 17 reaches the third pressure P3 from the second pressure P2, but until the pressure in the drying processing unit 17 reaches the atmospheric pressure from the second pressure P2.

That is, in the first modification, the inside of the drying processing unit 17 is decompressed at the same decompression rate from time T5 to time T6a until the pressure in the drying processing unit 17 changes from the second pressure P2 to the atmospheric pressure. In other words, the third pressure P3 according to the exemplary embodiment is a pressure that is equal to the atmospheric pressure in the first modification.

According to the first modification, by reducing the pressure in the drying processing unit 17 at the same decompression rate from the second pressure P2 to the atmospheric pressure, the inside of the drying processing unit 17 may be quickly decompressed to the atmospheric pressure as illustrated in FIG. 9A.

Figure 9B:
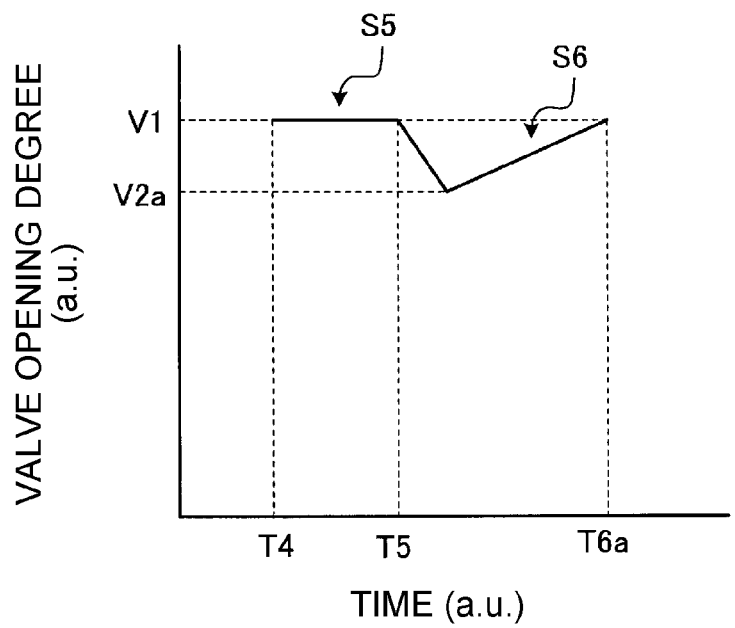
FIG. 9B is a view illustrating an example of a relationship between the time in the first decompressing process and the second decompressing process and the valve opening degree of the discharge valve according to the first modification of the exemplary embodiment.

FIG. 9B is a view illustrating an example of a relationship between the time in the first decompressing process (step S5) and the second decompressing process (step S6) and the valve opening degree of the discharge valve 60 according to the first modification of the exemplary embodiment. As illustrated in FIG. 9B, in the first modification, from time T5 when the pressure in the drying processing unit 17 becomes the second pressure P2 to time T6a when the atmospheric pressure is reached, the controller 19 gradually decreases the valve opening degree of the discharge valve 60 from the valve opening degree V1 to the valve opening degree V2a, and then gradually increases the valve opening degree of the discharge valve 60 to the valve opening degree V1. As a result, in the second decompressing process, the inside of the drying processing unit 17 may be decompressed to the atmospheric pressure at an equal decompression rate.

Figure 10:
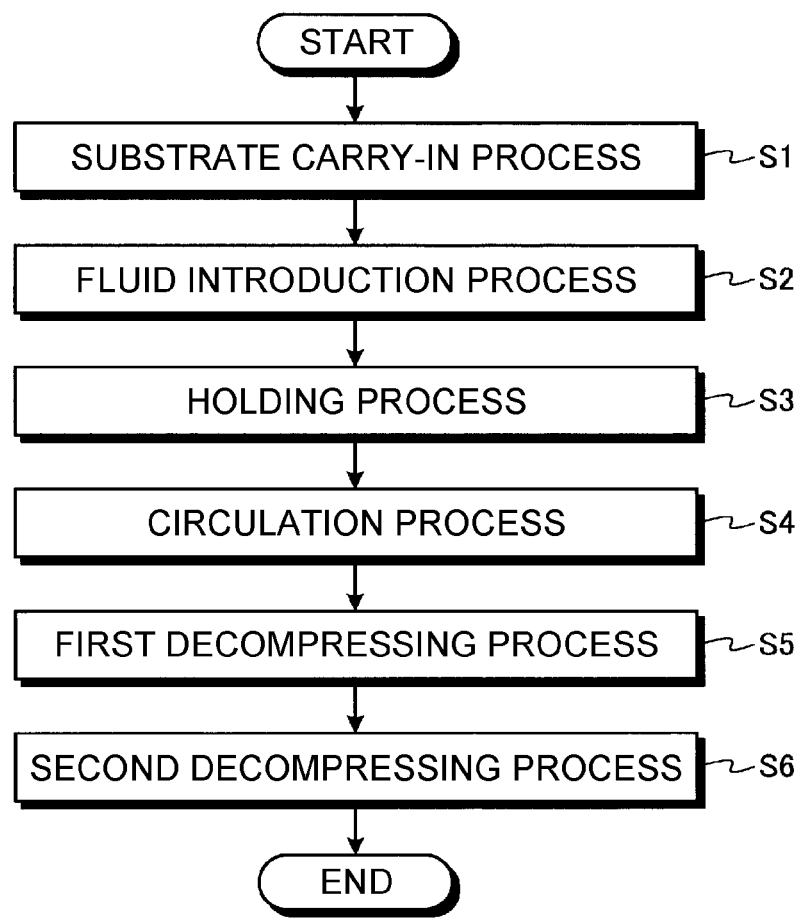
FIG. 10 is a flowchart illustrating a processing procedure in a drying process of a substrate processing system according to the first modification of the exemplary embodiment.

FIG. 10 is a flowchart illustrating the processing procedure in the drying process of the substrate processing system 1 according to the first modification of the exemplary embodiment. In the drying process of the substrate processing system 1 according to the first modification, as in the exemplary embodiment, the substrate carry-in process (step S1), the fluid introduction process (step S2), the holding process (step S3), the circulation process (step S4), and the first decompressing process (step S4) are sequentially performed. Descriptions of these processes will be omitted.

Following the first decompressing process, in the drying processing unit 17, a second decompressing process is performed to continuously discharge the processing fluid 70 from the inside of the drying processing unit 17 and further decompress the inside of the drying processing unit 17 (step S6). In the second decompressing process, the open/closed states of the valves 52a to 52f and the pressure regulating valve 59 are maintained in the open/closed state in the first decompressing process.

In the meantime, the controller 19 adjusts the valve opening degree of the discharge valve 60 in such a manner that the pressure in the drying processing unit 17 is decompressed at an equal decompression rate. For example, as illustrated in FIG. 9B, the controller 19 gradually decreases the valve opening degree of the discharge valve 60 from the valve opening degree V1 to the valve opening degree V2a, and then gradually increases the valve opening degree to the valve opening degree V1.

Then, the second decompressing process is performed until the pressure in the drying processing unit 17 reaches the atmospheric pressure from the second pressure P2. Upon completion of the second decompressing process, the drying process in the drying processing unit 17 according to the first modification is completed.

That is, in the first modification, the third decompressing process (step S7) according to the exemplary embodiment is omitted, and the first decompressing process and the second decompressing process reduces the pressure in the dry process unit 17 to the atmospheric pressure.

Figure 11A:
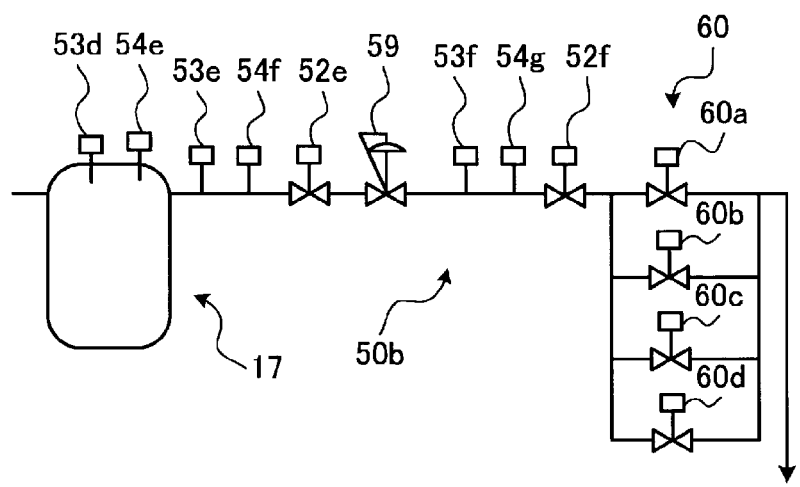
FIG. 11A is a view illustrating a configuration example of a system of a drying processing unit according to a second modification of the exemplary embodiment.

Next, a second modification of the drying process will be described with reference to FIGS. 11A and 11B. FIG. 11A is a view illustrating a configuration example of a system of a drying processing unit 17 according to the second modification of the exemplary embodiment. Also, in FIG. 11A, only the drying processing unit 17 and the discharge flow path 50b on the downstream side of the entire system of the drying processing unit 17 are illustrated.

As illustrated in FIG. 11A, in the second modification, the discharge flow paths 50b for discharging the processing fluid 70 from the drying processing unit 17 are provided in parallel on the downstream side of the valve 52f. For example, as illustrated in FIG. 11A, four valves are provided in parallel on the downstream side of the valve 52f.

Furthermore, four valves 60a to 60d are respectively provided in the discharge flow paths 50b provided in parallel to each other. That is, in the second modification, the discharge valve 60 is configured by a plurality of valves 60a to 60d provided in parallel.

Figure 11B:
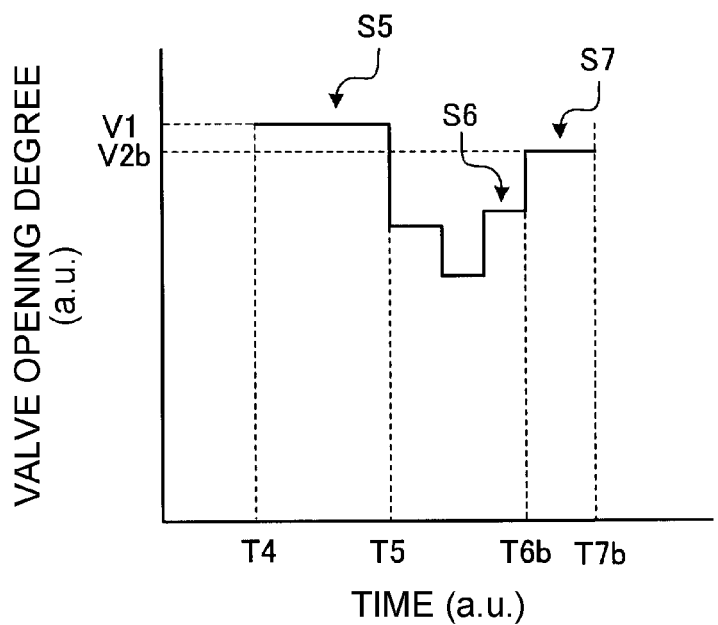
FIG. 11B is a view illustrating an example of a relationship between the time in a first decompressing process, a second decompressing process, and a third decompressing process and a valve opening degree of a discharge valve according to the second modification of the exemplary embodiment.

FIG. 11B is a view illustrating an example of a relationship between the time in a first decompressing process, a second decompressing process, and a third decompressing process and a valve opening degree of a discharge valve 60 according to the second modification of the exemplary embodiment. The valve opening degree V1 of the discharge valve 60 in the first decompressing process (step S5) illustrated in FIG. 11B is a total value of valve opening degrees of the four valves 60a to 60d. That is, in the second modification, in the first decompressing process, the four valves 60a to 60d are controlled to be in the open state.

Further, in the second decompressing process (step S6) performed subsequent to the first decompressing process, the controller 19 opens and closes the valves 60a to 60d in a predetermined combination from time T5 to time T6b, thereby decreasing the valve opening degree of the discharge valve 60 from V1 in a stepwise manner and then gradually increasing the valve opening degree of the discharge valve 60 to the valve opening degree V2b. As described above, in the second modification, by decreasing the valve opening degree of the discharge valve 60 in a stepwise manner and then gradually decreasing the valve opening degree of the discharge valve 60, it is possible to reduce the pressure in the drying processing unit 17 at an equal decompression rate.

Further, in the third decompressing process (step S7) performed subsequent to the second decompressing process, the controller 19 maintains a predetermined one of the valves 60a to 60d in the open state from time T6b to T7b, thereby maintaining the valve opening degree of the discharge valve 60 at the valve opening degree V2b.

In the second modification, as described above, the discharge valve 60 is configured by a plurality of valves 60a to 60d. As a result, the drying process may be performed by using the inexpensive valves 60a to 60d which may control only the fully open state or the fully closed state. Therefore, it is possible to perform the drying process of the substrate processing system 1 at low cost.

Further, in the second modification described above, the discharge flow path 50b and the plurality of valves 60a to 60d are configured in four parallels, but they are not limited to four parallels and may be plural in number.

Furthermore, in the second modification described above, after the second decompressing process, the third decompressing process is performed to reduce the pressure in the drying processing unit 17 to the atmospheric pressure. However, as described in the first modification, the second decompressing process may be performed until the inside of the drying processing unit 17 reaches the atmospheric pressure.

A substrate processing apparatus according to the exemplary embodiment is a substrate processing apparatus (substrate processing system 1) in which a drying process of drying a substrate (wafer W) using a processing fluid 70 in a supercritical state is performed. The substrate processing apparatus includes: a processing container (drying processing unit 17) in which the drying process is performed; a discharge valve 60 provided in a discharge flow path 50*b* for discharging the processing fluid 70 from the processing container (drying processing unit 17); and a controller 19 that controls the discharge valve 60. Further, when the pressure in the processing container (drying processing unit 17) is reduced from the first pressure P1 at which the processing fluid 70 is in the supercritical state through a second pressure P2 lower than the first pressure P1 and a third pressure P3 lower than the second pressure P2, the controller 19 controls the valve opening degree of the discharge valve 60 so that the decompression rate becomes equal from the second pressure P2 to the third pressure P3. Thus, in the drying method using the processing fluid 70 in the supercritical state, it is possible to shorten the time required for the entire drying process.

Further, in the substrate processing apparatus according to the exemplary embodiment, the processing fluid 70 is in the supercritical state at the second pressure P2 and in the gaseous state at the third pressure P3. As a result, it is possible to suppress generation of particles inside the drying processing unit 17, collapse of the pattern P of the wafer W, or the like.

Further, in the substrate processing apparatus according to the exemplary embodiment, when the processing container (drying processing unit 17) is decompressed from the first pressure P1 to the atmospheric pressure, the controller 19 controls the discharge valve 60 so that the valve opening degree thereof gradually decreases and then gradually increases. As a result, it is possible to shorten the decompressing time of the drying processing unit 17 while stably maintaining $CO_2$ in the drying processing unit 17.

Further, in the substrate processing apparatus according to the exemplary embodiment, the third pressure P3 is equal to the atmospheric pressure. As a result, it is possible to quickly decompress the inside of the drying processing unit 17 to the atmospheric pressure.

Further, in the substrate processing apparatus according to the exemplary embodiment, the discharge valve 60 is a variable valve whose valve opening degree is adjustable. As a result, it is possible to effectively suppress generation of particles inside the drying processing unit 17, collapse of the pattern P of the wafer W, or the like.

In addition, in the substrate processing apparatus according to the exemplary embodiment, at least a portion of the discharge flow paths 50*b* is provided in parallel, and the discharge valve 60 includes a plurality of valves 60*a* to 60*d* provided in the discharge flow paths 50*b* provided in parallel. As a result, it is possible to perform the drying process of the substrate processing system 1 at low cost.

Further, in the substrate processing apparatus according to the exemplary embodiment, an ejector is further provided in the discharge flow path 50*b* to cause a fluid to flow through a flow path different from the discharge flow path 50*b* and decompress the inside of the processing container (drying processing unit 17) using the flow of the fluid in the different flow path. The ejector is operated from the third pressure to the atmospheric pressure so as to decompress the inside of the processing container (drying processing unit 17). As a result, the decompressing time of the third decompressing process (step S7) may be further shortened.

In addition, a substrate processing method according to the exemplary embodiment is a substrate processing method by which a drying process of drying a substrate (wafer W) using a processing fluid 70 in a supercritical state is performed. The substrate processing method includes a first decompressing step (step S5), a second decompressing step (step S6), and a third decompressing step (step S7). In the first decompressing step (step S5), the inside of the processing container (drying processing unit 17) is decompressed in which the drying process is performed from the first pressure P1 at which the processing fluid 70 is in the supercritical state to the second pressure P2 lower than the first pressure P1. In the second decompressing step (step S6), the inside of the processing vessel (drying processing unit 17) is decompressed from the second pressure P2 to the third pressure P3 lower than the second pressure P2. In the third decompressing step (step S7), the inside of the processing container (drying processing unit 17) is decompressed from the third pressure P3 to the atmospheric pressure. Then, the second decompressing step (step S6) is performed in such a manner that the pressure in the processing container (drying processing unit 17) is decompressed at an equal decompression rate. Thus, in the drying method using the processing fluid in the supercritical state, it is possible to shorten the time required for the entire drying process.

Figure 12:
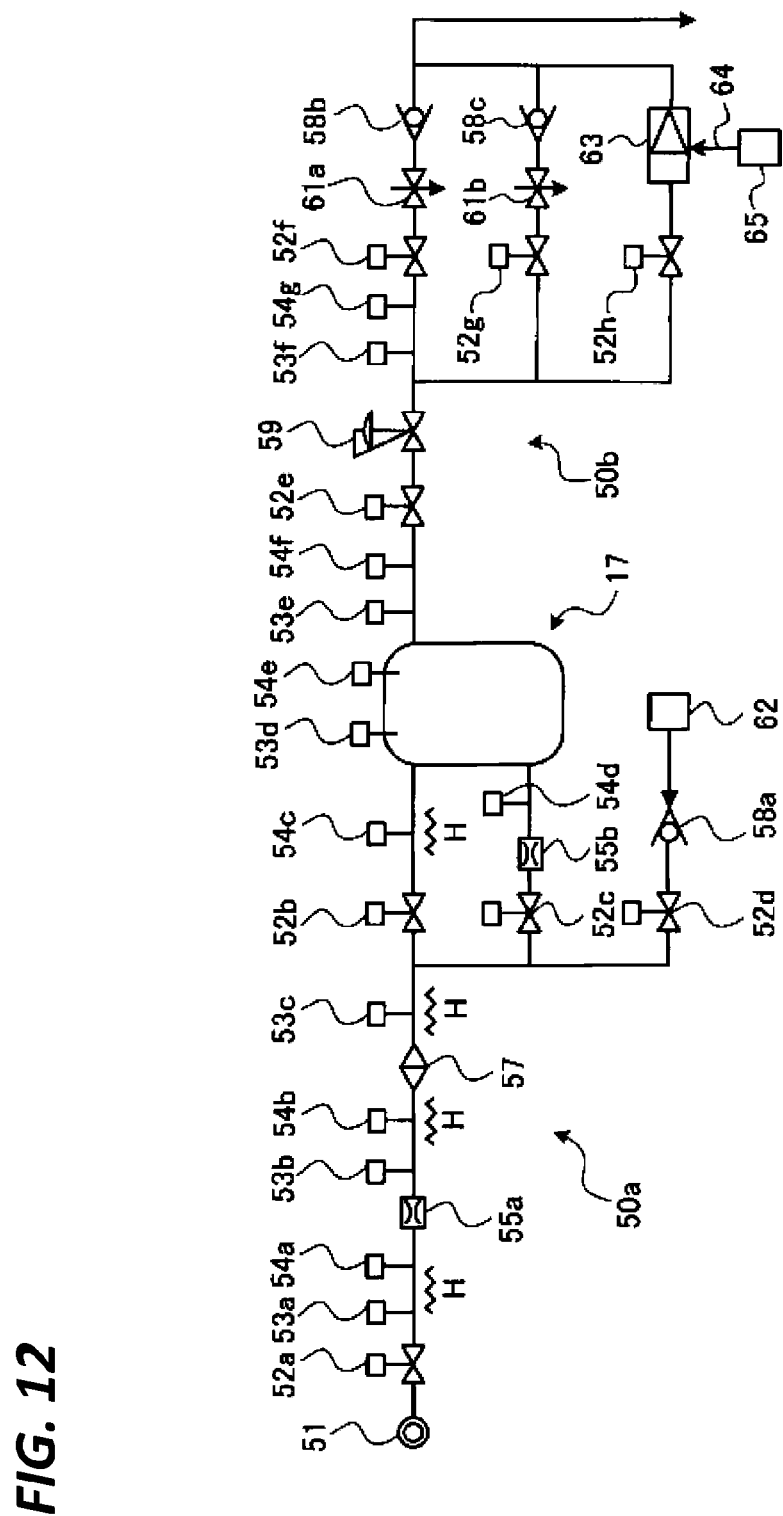
FIG. 12 is a view illustrating a configuration example of the entire system of a drying processing unit according to a third modification of the exemplary embodiment.

Subsequently, a third modification of the drying process will be described with reference to FIG. 12. FIG. 12 is a view illustrating a configuration example of the entire system of a drying processing unit 17 according to the third modification of the exemplary embodiment. Further, in FIG. 12, the upstream side of the valve 52*f* among the entire system of the drying processing unit 17 is common to the above-described exemplary embodiment, and the description thereof will be omitted.

On the downstream side of the valve 52*f*, a variable valve 61*a* and a check valve 58*b* are provided. The variable valve 61*a* is a valve that adjusts the discharge amount of the processing fluid 70 sent through the valve 52*f* to the outside, and the valve opening degree of the variable valve 61*a* is adjusted according to a desired discharge amount of the processing fluid 70. The check valve 58*b* is a valve that prevents backflow of the discharged processing fluid 70 and has a function of reliably discharging the processing fluid 70 to the outside.

Further, in the drying processing unit 17 illustrated in FIG. 12, the discharge flow path 50*b* branches off between the pressure regulating valve 59 and the valve 52*f*. Specifically, a discharge flow path 50*b* connected to the outside via the valve 52*g* and a discharge flow path 50*b* connected to the outside via the valve 52*h* branch off and extend from the discharge flow path 50*b* between the pressure regulating valve 59 and the valve 52*f*.

Like the valve 52*f*, the valve 52*g* and the valve 52*h* are valves for adjusting on/off of discharge of the processing fluid 70 to the outside. On the downstream side of the valve 52*g*, a variable valve 61*b* and a check valve 58*c* are provided to adjust the discharge amount of the processing fluid 70 and prevent the backflow of the processing fluid 70.

Here, in the third modification, the ejector 63 is provided on the downstream side of the valve 52*h*. In addition, the ejector 63 is connected to the fluid supply source 65 via a flow path 64 different from the discharge flow path 50*b*. When a fluid is caused to flow from the fluid supply source 65 via the flow path 64, a decompression state may be caused by the flow of the fluid. The fluid supplied from the fluid supply source 65 is, for example, air, water vapor, or the like.

Further, when the processing fluid 70 is discharged from the drying processing unit 17, one or more of the valve 52*f*, the valve 52*g*, and the valve 52*h* is controlled to an open state. Here, in the entire system of the drying processing unit 17, discharge of the processing fluid 70 to the outside is performed via a plurality of valves (valves 52*f*, 52*g*, and 52*h*), thereby capable of finely controlling the discharge amount of the processing fluid 70 to the outside.

Figure 13:
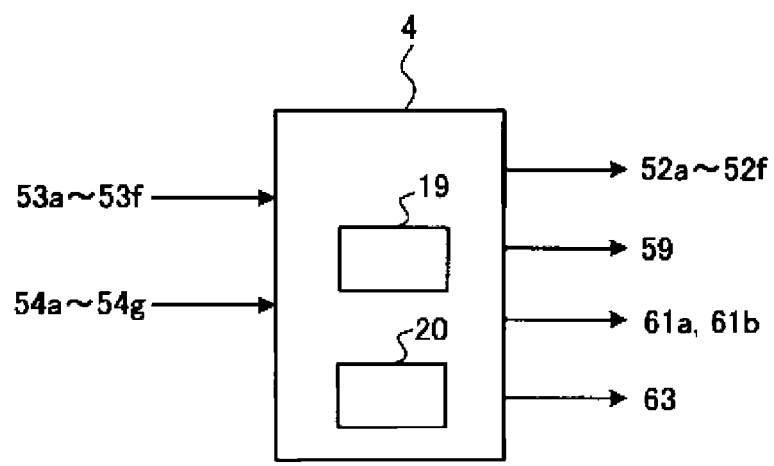
FIG. 13 is a block diagram illustrating a functional configuration of a control device according to a third modification of the exemplary embodiment.

FIG. 13 is a block diagram illustrating a functional configuration of a control device 401 according to the exemplary embodiment. As described above, the control device 401 includes the controller 19 and the storage unit 20. The control device 4 receives a measurement signal from various elements illustrated in FIG. 13, and also transmits a control instruction signal to various elements illustrated in FIG. 13.

The control device 4 receives, for example, the measurement results of the pressure sensors 53*a* to 53*f* and the temperature sensors 54*a* to 54*g*, and also transmits a control instruction signal to the valves 52*a* to 52*f*, the pressure regulating valve 59, variable valves 61*a* and 61*b*, and the ejector 63. Further, the signals that may be transmitted/received by the control device 4 are not particularly limited.

Figure 14:
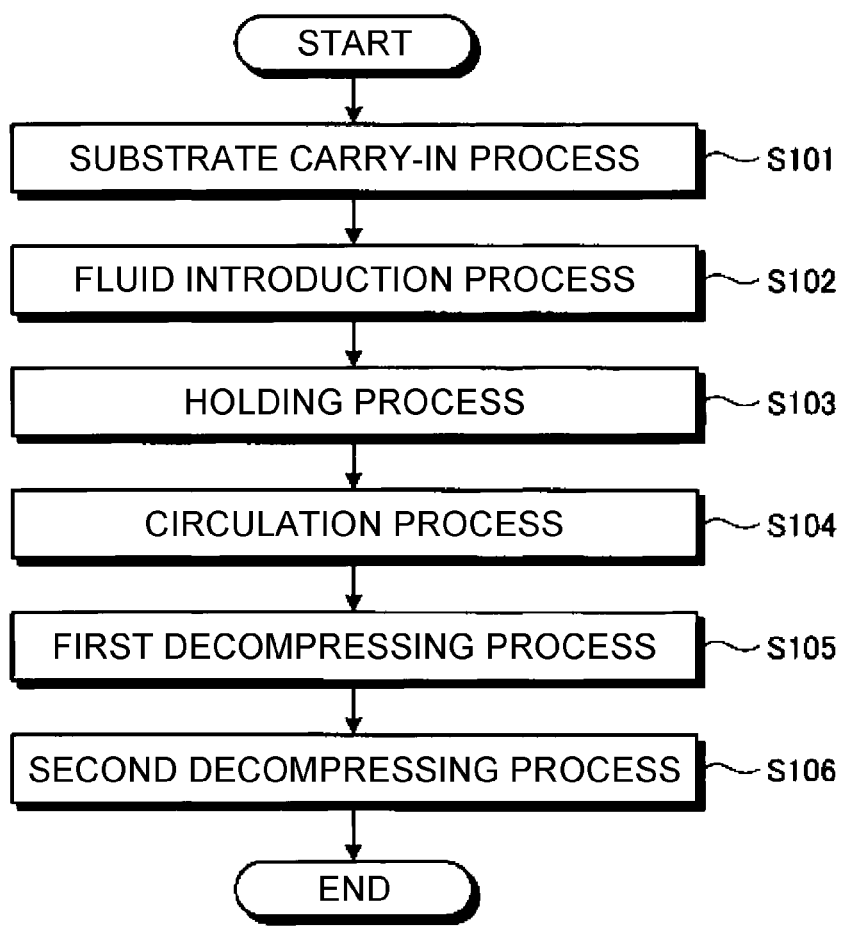
FIG. 14 is a flowchart illustrating a processing procedure in a drying process of a substrate processing system according to the third modification of the exemplary embodiment.

FIG. 14 is a flowchart illustrating a processing procedure in a drying process of a substrate processing system 1 according to the third modification of the exemplary embodiment. In the drying process of the substrate processing system 1 according to the third modification, as in the exemplary embodiment, the substrate carry-in process (step S101), the fluid introduction process (step S102), the holding process (step S103), and the circulation process (step S104) are sequentially performed. Descriptions of these processes will be omitted.

The first decompressing process (step S105) is performed, for example, by controlling the valve 52*f* to an open state and controlling the valve opening degree of the pressure regulating valve 59 and the variable valve 61*a* to the fully open state. Further, at this time, the valves 52*g* and 52*h* are controlled to be in the closed state.

Figure 15A:
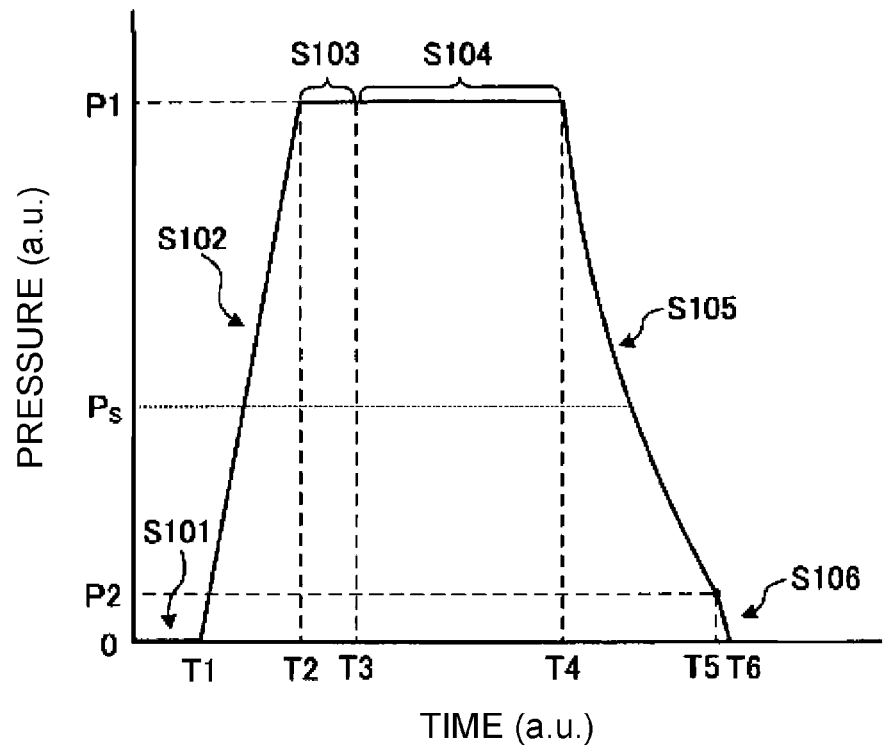
FIG. 15A is a view illustrating an example of a relationship between the time in the entire drying process and the pressure in the processing container according to the third modification of the exemplary embodiment.

Following the first decompressing process, as illustrated in FIG. 15A, in the drying processing unit 17, a second decompressing process of reducing the pressure in the drying processing unit 17 from the second pressure P2 to the atmospheric pressure is performed from time T5 to time T6 (step S106).

Here, in the second decompressing process, the valve 52*f* is changed from the open state to the closed state, the valve 52*h* is changed from the closed state to the open state, and the ejector 63 is operated. By operating the ejector 63, it is possible to forcibly exhaust the processing fluid 70 in the drying processing unit 17 using the flow of the fluid from the fluid supply source 65.

That is, since it is possible to promote the exhaust from the inside of the drying processing unit 17 whose internal pressure is close to the atmospheric pressure, the decompressing time may be shortened. Therefore, according to the exemplary embodiment, in the drying method using the processing fluid 70 in the supercritical state, it is possible to shorten the time required for the entire drying process.

Further, in the third modification, the second pressure P2 may be 0.1 MPa or more. By setting the second pressure P2 to 0.1 MPa or less, the second decompressing process may be started earlier. As a result, the total decompressing time may be further shortened.

Furthermore, in the third modification, the second pressure P2 may be 0.5 MPa or less. By setting the second pressure P2 to 0.5 MPa or less, it is possible to use an inexpensive ordinary ejector, and not an expensive ejector of a high pressure specification for the ejector 63. Therefore, it is possible to perform the drying process of the substrate processing system 1 at low cost.

Furthermore, in the above-described exemplary embodiment, the ejector 63 is used as the forced exhaust mechanism, but the second decompressing process (step S106) may be performed using a forced exhaust mechanism other than the ejector. For example, an inexpensive pump or the like may be used as a forced discharge mechanism.

In the meantime, since there is no moving portion in the ejector, it is harder to destroy the ejector than a pump. Thus, the second decompressing process (step S106) may be performed more stably using an ejector as a forced exhaust mechanism.

Further, in the above-described exemplary embodiment, by providing the ejector 63 in the branching discharge flow path in the discharge flow path 50*b*, it is possible to suppress causing the high-temperature and high-pressure processing fluid 70 to flow through the ejector 63 by the first decompressing process (step S105) or the like. Therefore, it is possible to suppress the ejector 63 from being adversely affected by being exposed to the high-temperature and high-pressure processing fluid 70.

Figure 15B:
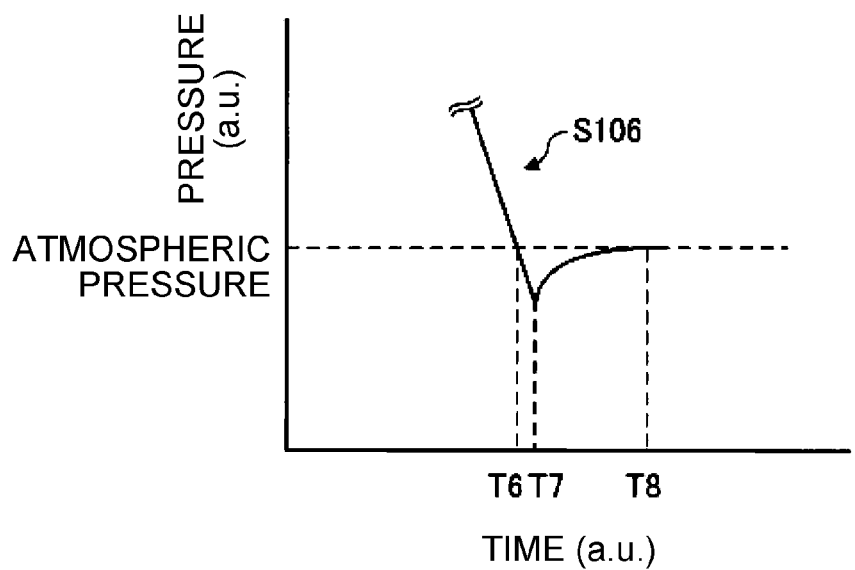
FIG. 15B is a view illustrating an example of a relationship between the time in a first decompressing process and an equal-rate decompressing process and a valve opening degree of a variable valve according to the third modification of the exemplary embodiment.

Next, a specific process of completing the second decompressing process (step S106) of the drying processing unit 17 returned to the atmospheric pressure at time T6 will be described with reference to FIG. 15B. FIG. 15B is a view illustrating an example of a relationship between the time in the second decompressing process and the pressure in the processing container according to the exemplary embodiment.

The controller 19 monitors the pressure in the drying processing unit 17 with the pressure sensor 53*d* and stops the operation of the ejector 63 at the timing when the pressure in the drying processing unit 17 becomes the atmospheric pressure (time T6). However, since there is a predetermined time lag before the operation of the ejector 63 is completely stopped, the decompression in the drying processing unit 17 is continued until time T7, and the pressure in the drying processing unit 17 is maintained at a negative pressure lower than the atmospheric pressure.

Here, in the exemplary embodiment, the valve 52*h* connected in series to the ejector 63 is maintained in the open state for a predetermined time even after the timing at which the ejector 63 is stopped (time T6). Then, the processing fluid 70 or the like exhausted so far flows backward from the discharge flow path 50*b* where the valve 52*h* and the ejector 63 are provided, and as illustrated in FIG. 15B, the pressure inside the drying processing unit 17 returns to the atmospheric pressure at time T8.

Therefore, by changing the valve 52*h* to the closed state at time T8 when the pressure in the drying processing unit returns to the atmospheric pressure, the inside of the drying processing unit 17 that has returned to the atmospheric pressure may be opened.

That is, in the exemplary embodiment, the operation of the ejector 63 is stopped at the timing when the pressure in the drying processing unit 17 is reduced to the atmospheric pressure (time T6), the operation of the ejector 63 is stopped for a predetermined time (from time T6 to time T8), and then the valve 52*h* is closed. Thus, when the ejector 63 is operated to forcibly exhaust the drying processing unit 17, the drying processing unit 17 may be opened smoothly. Here, the predetermined time is, for example, about 10 seconds.

A substrate processing apparatus according to the exemplary embodiment is a substrate processing apparatus in which a drying process of drying a substrate (wafer W) using a processing fluid 70 in a supercritical state is performed. The substrate processing apparatus includes: a processing container (drying processing unit 17) in which the drying process is performed; a forced exhaust mechanism (ejector 63) that is provided in a discharge flow path 50*b* for discharging the processing fluid 70 from the processing container (drying processing unit 17) and forcibly exhausts and decompresses the inside of the processing container (drying processing unit 17); and a controller 19 that controls the forced exhaust mechanism (ejector 63). Further, when the inside of the processing container (drying processing unit 17) is decompressed from the first pressure P at which the processing fluid 70 is in the supercritical state to the atmospheric pressure, through a second pressure P2 lower than the first pressure P1, the controller 19 does not operate the forced exhaust mechanism (ejector 63) from the first pressure P1 to the second pressure P2 and operates the forced exhaust mechanism (ejector 63) from the second pressure P2 to the atmospheric pressure. Thus, in the drying method using the processing fluid 70 in the supercritical state, it is possible to shorten the time required for the entire drying process.

In addition, in the substrate processing apparatus according to the exemplary embodiment, the forced exhaust mechanism is an ejector 63 that is provided in the discharge flow path 50b and uses the flow of the fluid in a different flow path 64 by causing the fluid to flow through the flow path 64 different from the discharge flow path 50b. As a result, the second decompressing process may be performed more stably.

Further, in the substrate processing apparatus according to the exemplary embodiment, the second pressure P2 is set to 0.1 MPa or more and 0.5 MPa or less. As a result, it is possible to further shorten the entire decompressing time and to perform the drying process of the substrate processing system 1 at low cost.

Further, the substrate processing apparatus according to the exemplary embodiment further includes a valve 52h that is provided in series with the forced exhaust mechanism (ejector 63) in the discharge flow path 50b and that is controllable by the controller 19. Then, the controller 19 stops the operation of the forced exhaust mechanism (ejector 63) at the timing when the inside of the processing container (drying processing unit 17) becomes the atmospheric pressure, and after a lapse of a predetermined time from the time of stopping the operation of the forced exhaust mechanism (ejector 63), the controller closes the valve 52h. As a result, the drying processing unit 17 may be opened smoothly.

Further, the substrate processing apparatus according to the exemplary embodiment further includes a variable valve 61a provided in the discharge flow path 50b and controllable by the controller 19. In addition, the controller 19 controls the valve opening degree of the variable valve 61a so that the decompression rate is obtained to the second pressure P2 from the third pressure P3 lower than the first pressure P1 and higher than the second pressure P2. As a result, in the drying method using the processing fluid 70 in the supercritical state, it is possible to further shorten the time required for the entire drying process.

Further, in the substrate processing apparatus according to the exemplary embodiment, the processing fluid 70 is in the supercritical state at the third pressure P3 and in the gaseous state at the second pressure P2. As a result, it is possible to suppress generation of particles inside the drying processing unit 17, collapse of the pattern P of the wafer W, or the like.

Further, in the substrate processing apparatus according to the exemplary embodiment, the forced exhaust mechanism (ejector 63) is provided in the discharge flow path branching off from the discharge flow path 50b. As a result, it is possible to suppress the ejector 63 from being adversely affected by being exposed to the high-temperature and high-pressure processing fluid 70.

Further, the substrate processing method according to the exemplary embodiment is a substrate processing method in which a drying process of drying a substrate (wafer W) in a processing container (drying processing unit 17) using a processing fluid 70 in a supercritical state is performed. The substrate processing method includes: a first decompressing step of reducing the pressure in the processing container (drying processing unit 17) from the first pressure P1 at which the processing fluid 70 is in the supercritical state to the second pressure P2 lower than the first pressure P1 (S105); and a second decompressing step (S105) of reducing the pressure in the processing container (drying processing unit 17) from the second pressure P2 to the atmospheric pressure (S106). Further, the second decompressing step (S106) is performed by operating the forced exhaust mechanism (ejector 63) that is provided in the discharge flow path 50b of the processing container (drying processing unit 17) and forcibly exhausts and decompresses the inside of the processing container (drying processing unit 17). Thus, in the drying method using the processing fluid 70 in the supercritical state, it is possible to shorten the time required for the entire drying process.

In addition, in the substrate processing method according to the exemplary embodiment, the forced exhaust mechanism is the ejector 63 that is provided in the discharge flow path 50b and uses the flow of the fluid in a flow path 64 different from the discharge flow path 50b by causing the fluid to flow through the different flow path 64. As a result, the second decompressing process may be performed more stably.

In the substrate processing apparatus according to the exemplary embodiment, an inexpensive ordinary ejector is used as the forced exhaust mechanism, but it is not limited thereto, and a forced exhaust mechanism such as an inexpensive pump may be used.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing apparatus comprising:
   a processing container in which a drying process is performed using a processing fluid in a supercritical state;
   a discharge valve provided in a discharge flow path that discharges the processing fluid from the processing container; and
   a controller configured to control the discharge valve to decompress an inside of the processing chamber from a first pressure at which the processing fluid is in the supercritical state to an atmospheric pressure, through a second pressure lower than the first pressure, and then to a third pressure lower than the second pressure,
   wherein the controller controls a valve opening degree of the discharge valve in such a manner that a decompression rate is equal from the second pressure to the third pressure.

2. The substrate processing apparatus of claim 1, wherein the processing fluid is in the supercritical state at the second pressure and in a gaseous state at the third pressure.

3. The substrate processing apparatus of claim 1, wherein, when the processing container is decompressed from the first pressure to an atmospheric pressure, the controller controls the discharge valve so as to gradually decrease the valve opening degree and then gradually increase the valve opening degree.

4. The substrate processing apparatus of claim 1, wherein the third pressure is equal to the atmospheric pressure.

5. The substrate processing apparatus of claim 1, wherein the discharge valve is a variable valve of which the valve opening degree is adjustable.

6. The substrate processing apparatus of claim 1, wherein the discharge flow path includes two or more discharge flow path portions which are arranged in parallel, and
two or more discharge valves are provided in the two or more discharge flow path portions, respectively.

7. The substrate processing apparatus of claim 1, wherein the discharge flow path includes an ejector further provided therein to cause the fluid to flow through a flow path different from the discharge flow path and to decompress the inside of the processing container using a flow of the fluid in the different flow path, and
the ejector is operated from the third pressure to the atmospheric pressure to decompress the inside of the processing container.

8. A substrate processing apparatus comprising:
a processing container in which a drying process is performed using a processing fluid in a supercritical state;
a discharge valve provided in a discharge flow path that discharges the processing fluid from and inside of the processing container;
an ejector provided in the discharge flow path and connected to a liquid supply via a liquid supply path separate from the discharge path, the ejector being configured to forcibly exhaust and decompress the inside of the processing container when a fluid flows from the liquid supply to the ejector via the liquid supply path; and
a controller configured to control the ejector to decompress the inside of the processing container from a first pressure at which the processing fluid is in the supercritical state to a second pressure lower than the first pressure,
wherein the controller does not operate the ejector from the first pressure to the second pressure and operates the ejector from the second pressure to the atmospheric pressure.

9. A substrate processing method comprising:
a first decompressing that decompresses an inside of a processing container in which a drying process is performed using a processing fluid in a supercritical state from a first pressure at which the processing fluid is in the supercritical state to a second pressure lower than the first pressure;
a second decompressing that decompresses the inside of the processing container from the second pressure to a third pressure lower than the second pressure; and
a third decompressing that decompresses the inside of the processing container from the third pressure to an atmospheric pressure,
wherein the second decompressing is performed in such a manner that a pressure in the processing container is reduced at a constant decompression rate.

\* \* \* \* \*